(12) United States Patent
Cheriton et al.

(10) Patent No.: US 9,870,824 B2
(45) Date of Patent: *Jan. 16, 2018

(54) ITERATOR REGISTER FOR STRUCTURED MEMORY

(71) Applicant: Intel Corporation, Santa Clara, CA (US)

(72) Inventors: David R. Cheriton, Palo Alto, CA (US); Amin Firoozshahian, Mountain View, CA (US); Alexandre Y. Solomatnikov, San Carlos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/461,262

(22) Filed: Mar. 16, 2017

(65) Prior Publication Data

US 2017/0249992 A1   Aug. 31, 2017

Related U.S. Application Data

(63) Continuation of application No. 12/842,958, filed on Jul. 23, 2010, now Pat. No. 9,601,199, which is a
(Continued)

(51) Int. Cl.
*G11C 15/00* (2006.01)

(52) U.S. Cl.
CPC .................................. *G11C 15/00* (2013.01)

(58) Field of Classification Search
CPC ....................................................... G11C 15/00
See application file for complete search history.

(56) References Cited

U.S. PATENT DOCUMENTS

| 4,695,949 A | 9/1987 | Thatte et al. |
| 4,989,137 A | 1/1991 | Oxley et al. |

(Continued)

FOREIGN PATENT DOCUMENTS

| CN | 1202653 A | 12/1998 |
| CN | 1462388 A | 12/2003 |

(Continued)

OTHER PUBLICATIONS

Brad Fitzpatrick, Distributed Caching with Memcached, Linux Journal, Aug. 1, 2004.
(Continued)

*Primary Examiner* — Michael Alsip
(74) *Attorney, Agent, or Firm* — Schwabe, Williamson & Wyatt, P.C

(57) ABSTRACT

Loading data from a computer memory system is disclosed. A memory system is provided, wherein some or all data stored in the memory system is organized as one or more pointer-linked data structures. One or more iterator registers are provided. A first pointer chain is loaded, having two or more pointers leading to a first element of a selected pointer-linked data structure to a selected iterator register. A second pointer chain is loaded, having two or more pointers leading to a second element of the selected pointer-linked data structure to the selected iterator register. The loading of the second pointer chain reuses portions of the first pointer chain that are common with the second pointer chain.

Modifying data stored in a computer memory system is disclosed. A memory system is provided. One or more iterator registers are provided, wherein the iterator registers each include two or more pointer fields for storing two or more pointers that form a pointer chain leading to a data element. A local state associated with a selected iterator register is generated by performing one or more register
(Continued)

operations relating to the selected iterator register and involving pointers in the pointer fields of the selected iterator register. A pointer-linked data structure is updated in the memory system according to the local state.

26 Claims, 12 Drawing Sheets

Related U.S. Application Data continuation-in-part of application No. 12/653,889, filed on Dec. 17, 2009, now Pat. No. 8,065,476, which is a continuation of application No. 12/011,311, filed on Jan. 25, 2008, now Pat. No. 7,650,460.

(60) Provisional application No. 60/897,773, filed on Jan. 26, 2007, provisional application No. 61/273,179, filed on Jul. 31, 2009.

(56) References Cited

U.S. PATENT DOCUMENTS

| | | | |
|---|---|---|---|
| 5,247,634 A | 9/1993 | Cline et al. |
| 5,459,690 A | 10/1995 | Rieger et al. |
| 5,548,775 A | 8/1996 | Hershey |
| 5,625,813 A | 4/1997 | Venn |
| 5,652,864 A | 7/1997 | Hine |
| 5,685,005 A | 11/1997 | Garde et al. |
| 5,732,337 A | 3/1998 | Wargnier et al. |
| 5,784,699 A | 7/1998 | McMahon et al. |
| 5,822,749 A | 10/1998 | Agarwal |
| 5,950,231 A | 9/1999 | Nichol |
| 6,349,372 B1 | 2/2002 | Benveniste et al. |
| 6,449,667 B1 | 9/2002 | Ganmukhi et al. |
| 6,453,403 B1 | 9/2002 | Czajkowski |
| 6,643,755 B2 | 11/2003 | Goodhue et al. |
| 6,754,776 B2 | 6/2004 | Conway et al. |
| 6,789,156 B1 | 9/2004 | Waldspurger |
| 6,848,029 B2 | 1/2005 | Coldwewy |
| 6,934,796 B1 | 8/2005 | Pereira et al. |
| 7,096,322 B1 | 8/2006 | Sollom et al. |
| 7,245,623 B1 | 7/2007 | Cheriton |
| 7,254,748 B1 | 8/2007 | Wright et al. |
| 7,257,693 B2 | 8/2007 | Newburn et al. |
| 7,269,542 B2 | 9/2007 | Ruetsch |
| 7,293,155 B2 | 11/2007 | Mehta et al. |
| 7,650,460 B2 | 1/2010 | Cheriton |
| 7,773,676 B2 | 8/2010 | Chung, II |
| 8,065,476 B2 | 11/2011 | Cheriton |
| 8,230,168 B2 | 7/2012 | Cheriton |
| 8,612,673 B2 | 12/2013 | Cheriton |
| 8,782,373 B2 | 7/2014 | Karamcheti et al. |
| 8,938,580 B2 | 1/2015 | Cheriton |
| 9,520,193 B2 | 12/2016 | Cheriton |
| 2002/0133668 A1 | 9/2002 | Sherman |
| 2002/0156820 A1 | 10/2002 | Kishi |
| 2002/0184579 A1 | 12/2002 | Alvarez et al. |
| 2003/0093616 A1 | 5/2003 | Slavin |
| 2003/0131348 A1 | 7/2003 | Hogstrom et al. |
| 2003/0135641 A1 | 7/2003 | Cheriton |
| 2003/0236961 A1 | 12/2003 | Qiu et al. |
| 2004/0107312 A1 | 6/2004 | Ruetsch |
| 2004/0186840 A1 | 9/2004 | Dettinger et al. |
| 2005/0065955 A1 | 3/2005 | Babikov |
| 2005/0090940 A1 | 4/2005 | Pajakowski et al. |
| 2005/0160234 A1 | 7/2005 | Newburn et al. |
| 2006/0059314 A1 | 3/2006 | Bouchard et al. |
| 2006/0155875 A1 | 7/2006 | Cheriton |
| 2007/0022246 A1 | 1/2007 | Regev et al. |
| 2007/0250663 A1 | 10/2007 | Welsh et al. |
| 2008/0109614 A1 | 5/2008 | Begon et al. |
| 2008/0183958 A1 | 7/2008 | Cheriton |
| 2009/0112880 A1 | 4/2009 | Oliveira |
| 2009/0164754 A1 | 6/2009 | Cheriton |
| 2009/0187726 A1 | 7/2009 | Serebrin et al. |
| 2009/0198967 A1 | 8/2009 | Blaner et al. |
| 2009/0319722 A1 | 12/2009 | Murin et al. |
| 2010/0070698 A1 | 3/2010 | Ungureanu et al. |
| 2010/0100673 A1 | 4/2010 | Cheriton |
| 2010/0107243 A1 | 4/2010 | Moyer et al. |
| 2010/0115228 A1 | 5/2010 | Parker et al. |
| 2011/0010347 A1 | 1/2011 | Cheriton et al. |
| 2011/0238917 A1 | 9/2011 | Lin et al. |
| 2013/0024645 A1 | 1/2013 | Cheriton et al. |
| 2013/0031331 A1 | 1/2013 | Cheriton |
| 2017/0109049 A1 | 4/2017 | Cheriton |

FOREIGN PATENT DOCUMENTS

| | | |
|---|---|---|
| CN | 102197368 A | 9/2011 |
| TW | 308661 | 6/1997 |
| TW | 457424 B | 10/2001 |
| TW | I228653 B | 3/2005 |
| TW | I260636 B | 8/2006 |
| TW | 200941349 A | 10/2009 |

OTHER PUBLICATIONS

Chang et al., Bigtable: A Distributed Storage System for Structured Data, OSDI 2006.
Walpole et al., Maintaining Consistency in Distributed Software Engineering Environments, 1998, pp. 418-425, 8th International Conference on Distributed Computing Systems.
Quinn et al. "Network Based Coherency: Extending a Processor's Coherency Domain over a Standard Network," Hot , Chips 20, Aug. 2008.
R. Merritt, "Startups give virtualization a novel twist", EE Times, Mar. 31, 2008.
R. Merritt, "3Leaf links 32 AMD chips in one server", EE Times, Nov. 3, 2009.
Kota et al., "Large Scale SMP for Opterons," Hot Chips 16, Aug. 23, 2004.
Kota et al., "Horns: Large-Scale Symmetric Multiprocessing for Opteron Systems," IEEE Micro 25, 2, pp. 30-40, Mar. 2005.
R. Kota, "Horus: Large Scale SMP using AMD OpteronTM processors", Apr. 9, 2005.
C. Monash, XtremeData Inc., "XtremeData announces its DBx data warehouse appliance", Jul. 27, 2009.
C. Monash, "Kickfire's FPGA-based technical strategy," Aug. 21, 2009.
Mueller et al., "FPGA: what's in it for a database?" In Proceedings of the 35th SIGMOD international Conference on Management of Data, Jun. 29-Jul. 2, 2009.
Jack B. Dennis, General parallel computation can be performed with a cycle-free heap. Proceedings of the 1998 International Conference on Parallel Architectures and Compiling Techniques., pp. 96-103, 1998.
Jack B. Dennis, "Fresh Breeze: a multiprocessor chip architecture guided by modular programming principles," SIGARCH Comput. Archit. News Mar. 31, 2003.
Jack B. Dennis, The Fresh Breeze Model of Thread Execution. Workshop on Programming Models for Ubiquitous Parallelism, with PACT-2006, Sep. 2006.
I. Ginzburg "Compiling array computations for the fresh breeze parallel processor," Thesis for the Master of Engineering degree, MIT Department of Electrical Engineering and Computer Science, May 2007.
Dennis et al., "Collaborative Research: Programming Models and Storage System for High Performance Computation with Many-Core Processors," CAPSL Technical Memo 088, May 11, 2009.
Inenaga et al., On-Line Construction of Compact Directed Acyclic Word Graphs, in Discrete Applied Mathematics, 12th Annual Symposium on Combinatorial Pattern Matching, Published Feb. 24, 2004.
Fourth Office Action dated Feb. 26, 2016, issued in corresponding Chinese Patent Application for Invention No. 201080044937.9, 8 pages.

(56) References Cited

OTHER PUBLICATIONS

Second Chinese Office Action dated May 18, 2016, issued in corresponding Chinese Application No. 201310403763.6.
Third Chinese Office Action dated Nov. 7, 2016, issued in corresponding Chinese Application No. 201310403763.6, 20 pages.
Non-Final Office Action dated Jul. 22, 2013, issued in related U.S. Appl. No. 12/842,958, 11 pages.
Final Office Action dated Nov. 25, 2013, issued in related U.S. Appl. No. 12/842,958, 11 pages.
Non-Final Office Action dated Aug. 13, 2014, issued in related U.S. Appl. No. 12/842,958, 8 pages.
Final Office Action dated Feb. 25, 2015, issued in related U.S. Appl. No. 12/842,958, 10 pages.
Non-Final Office Action dated Oct. 28, 2015, issued in related U.S. Appl. No. 12/842,958, 11 pages.
Final Office Action dated May 24, 2016, issued in related U.S. Appl. No. 12/842,958, 19 pages.
Notice of Allowance dated Nov. 9, 2016, issued in related U.S. Appl. No. 12/842,958, 14 pages.
Office Action dated Jul. 7, 2017, issued in related European Patent Application No. 08 724 801.9, 5 pages.

ITERATOR REGISTER FOR STRUCTURED MEMORY

CROSS REFERENCE TO RELATED APPLICATIONS

The present application is a continuation of U.S. patent application Ser. No. 12/842,958 filed Jul. 23, 2010 entitled "ITERATOR REGISTER FOR STRUCTURED MEMORY," now U.S. Pat. No. 9,601,199; which is a continuation-in-part of U.S. patent application Ser. No. 12/653,889 filed Dec. 17, 2009 entitled "HIERARCHICAL IMMUTABLE CONTENT-ADDRESSABLE MEMORY PROCESSOR," now U.S. Pat. No. 8,065,476; which is a continuation of U.S. patent application Ser. No. 12/011,311 filed Jan. 25, 2008 entitled "HIERARCHICAL IMMUTABLE CONTENT-ADDRESSABLE MEMORY PROCESSOR," now U.S. Pat. No. 7,650,460; which claims the benefit of U.S. Provisional Patent Application No. 60/897,773 filed Jan. 26, 2007, the contents of which are incorporated herein by reference in their entirety. U.S. patent application Ser. No. 12/842,958 filed Jul. 23, 2010 entitled "ITERATOR REGISTER FOR STRUCTURED MEMORY," also claims the benefit of U.S. Provisional Patent Application No. 61/273,179 filed Jul. 31, 2009, the contents of which is also incorporated herein by reference in its entirety.

BACKGROUND OF THE INVENTION

Some computer systems have endeavored to provide processor and memory support for complex data structures. For example, some structured memory systems provide support for sparse arrays as well as automatic memory and reference management. However, hardware data structure support can introduce extra complexity and overhead relative to a specialized software data structure for each possible use.

Computer systems are moving to support an increasing number of parallel executing processor cores, allowing greater concurrency. This can increase the difficulty of efficiently accessing software data structures. There is a need to deal with concurrent access, to ensure that copies are consistent, that updates do not interfere, and that complex updates can be performed atomically.

BRIEF DESCRIPTION OF THE DRAWINGS

Various embodiments of the invention are disclosed in the following detailed description and the accompanying drawings.

DETAILED DESCRIPTION

Figure 1:
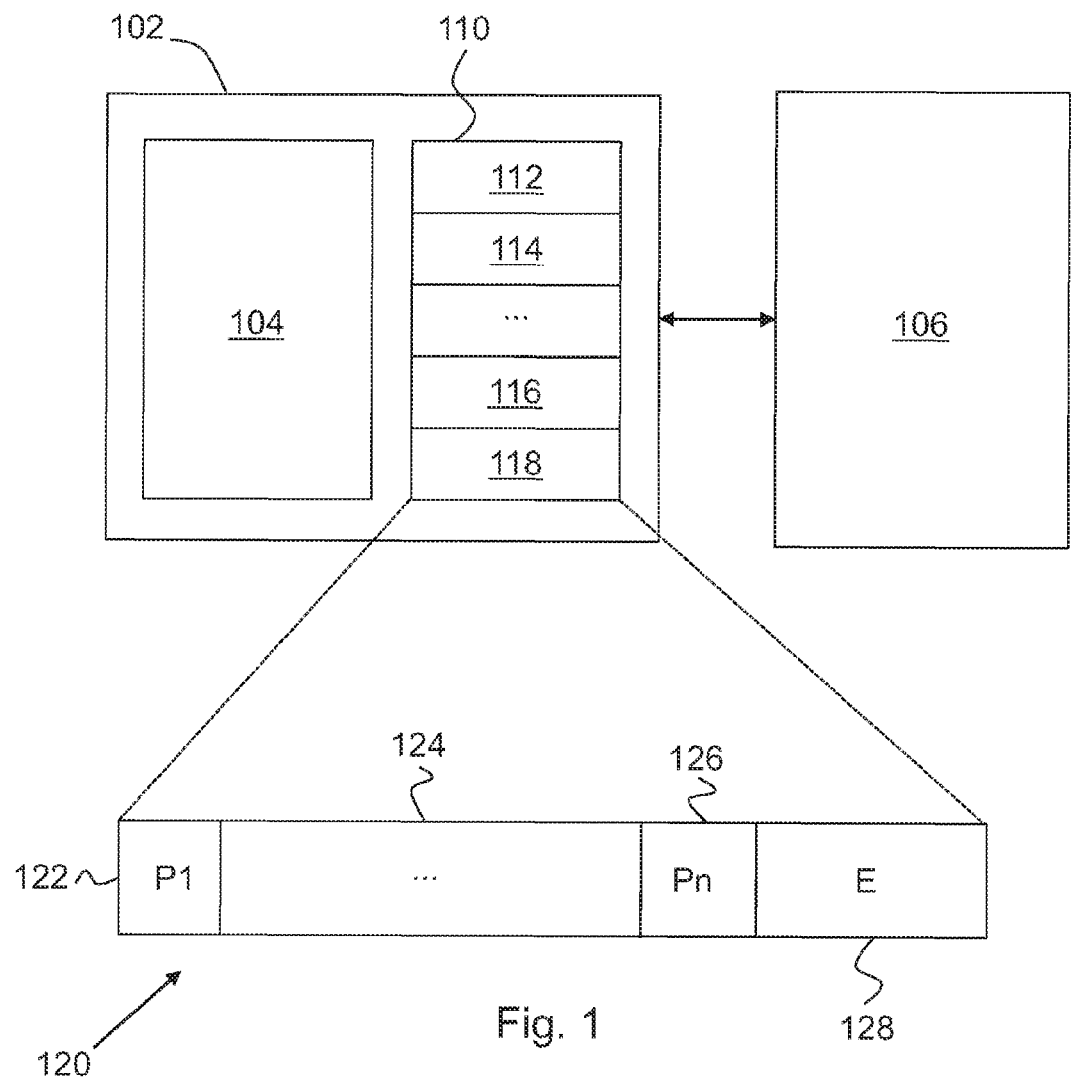
FIG. 1 is a block diagram of an embodiment of the invention.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A computer memory system is normally accessed as a linear array with a memory cell (byte or word) associated with each address A, starting at 0 and extending contiguously to the maximum provisioned physical address, MPA.

Conventional memory access by the processor entails a load instruction that specifies register Rd and Ra, causing a load (i.e. a read) of a datum into register Rd at address A where A is a value stored in register Ra. Ra is commonly referred to as an address or index register. (As an optimization, a memory address to load or store can often also be specified directly in the instruction itself or relative to some base address.)

In contrast to this simple hardware model, software necessarily often uses a more complex approach to accessing the desired data, driven by software requirements. In particular, a software application commonly has a collection of values each identified/indexed by some key value with a large range of values. For example, one collection may be indexed by a variable-length character string value which has an unbounded number of possible string values. This is commonly referred to as an associative array. As another example, a collection may be indexed by an IPv6 address which is 128 bits in length. In both cases, the number of possible key values is large so it is infeasible to use a direct mapping from key to memory cell. Consequently, software conventionally implements its access to data in these cases as a series of memory load operations using address/index registers as described above. For example, it may read the entire string to compute a so-called hash value, and then use a truncated value from this hash value as an offset to compute an address of a linear array (the hash vector), access the entry at that computed address, and then compare the argument key to the key at the entry and then load the value at that entry if the key matches, and otherwise perform some action to find other possible entries that might match, using the hash collision action of this data structure. The latter case in a linked hash table requires loading an address stored in this first entry that points to another entry, and accessing this other entry, repeating the key comparison. Consequently, loading the desired value can entail tens to hundreds (or more) additional load operations.

Moreover, software is often performing operations that apply to each member of a collection, referred to as iterating over the collection. It is common for hardware to support prefetching when iteration is over a contiguous in-memory data structure, namely an array. However, with the complex non-contiguous memory structures used by software, the hardware prefetch mechanisms are ineffective in general because the next data element for software is not the next data element relative to the last address load/store issued by hardware.

Similarly, a software modification to a memory data structure can entail numerous load and store operations because of the complex data structure required to handle a collection element as above. Complex variable-sized data structures also introduce overhead for allocating memory and freeing memory.

Some computer systems have endeavored to provide processor and memory support for complex data structures. For example, HICAMP (as described in greater detail in the above-referenced U.S. patent application Ser. No. 12/653, 889) provides support for sparse arrays as well as automatic memory and reference management, supporting the above form of collection and others. However, hardware data structure support can introduce extra complexity and overhead relative to a specialized software data structure for each possible use. For example, sparse matrices in software use different representations. Fresh Breeze is another system that provides hardware support for a structured memory, supporting sparse arrays.

Improved efficiency for memory access is disclosed by employing a computer architecture that includes iterator registers. Here and throughout this description, the term "register" refers to a small amount of storage available on a computer processing unit that can be accessed more rapidly by the associated processing unit than other categories of system memory, for example the main memory and/or cache. In some embodiments, although different registers can have different access times, a slow register is faster than cache and/or main memory.

Each iterator register includes two or more pointer fields which provide storage for two or more pointers that form a pointer chain leading to a data element. Preferably, this data element is also stored in its corresponding iterator register (although data elements can also be stored elsewhere, such as in main memory and/or cache). Thus an iterator register differs from a conventional address register as described above by providing for storage of a pointer chain having 2 or more pointers in it, as opposed to a single pointer. The term pointer chain refers to a set of pointers which are linked such that each pointer in the chain points to a next pointer in the chain, except for the final pointer which points to the data element. Registers providing for storage of pointer chains are referred to herein as "iterator registers" because they greatly facilitate the common operation of systematically iterating over all elements of a pointer-linked data structure. Thus an architecture having iterator registers provides numerous advantages when data stored in a computer memory system is organized as one or more pointer-linked data structures.

Preferred embodiments can include one or more of the following features, individually or in any combination. The pointer linked data structures in system memory can be constructed from immutable physical memory blocks, where no change is allowed to the contents of a block while it is in active use (e.g., referenced) by the system. The pointer linked data structures can be constructed from physical memory blocks where a non-duplication convention is enforced, such that no two active physical memory blocks have the same contents. The use of immutable, non-duplicated memory blocks is a characteristic feature of the HICAMP architecture, as described in greater detail in the above-referenced U.S. patent application Ser. No. 12/653, 889, which is incorporated herein by reference for all purposes. Access to system memory can be exclusively by way of the iterator registers. The number of iterator registers that are active for a particular processor can be altered under software control. Processors can include conventional registers in addition to iterator registers as described above.

To summarize the main points, it is helpful to separately consider operations where data comes from other system memory and goes to an iterator register (referred to herein as memory load or register write operations) and operations where data goes from an iterator register to other system memory (referred to herein as memory store or register read operations).

Pointer chain information in an iterator register can be partially or fully cached during successive memory load operations for an in-memory pointer-linked data structure performed through the iterator register. For example, if elements A[100] and A[101] of a pointer-linked data structure A have corresponding pointer chains that each have 5 pointers and only differ in the final pointer, then accessing A[101] via an iterator register after accessing A[100] via the iterator register would only require the loading of one pointer from memory to the register. In sharp contrast, conventional approaches would require loading all five pointers relating to A[101] in order to follow the links from the root of A to A[101].

In this example, the loading of A[100] from memory can be regarded as a first loading of a first data element that writes a first pointer chain to the iterator register. Similarly, the loading of A[101] from memory can be regarded as a second loading of a second data element that writes a second pointer chain to the iterator register. The second loading only writes pointers in the iterator register where the second pointer chain differs from the first pointer chain. As in this example, the second loading can be a next non-default element in the data structure after the first element. Prefetching of the second element can be provided. The data structure can be efficiently and systematically accessed by iterating through the iterator register. In some embodiments, the in-memory representation of pointer chains is compacted. In these embodiments, the compacted pointer representation in memory can be translated to a non-compacted representation in the iterator register, as part of memory load.

In situations where system memory is immutable (e.g., a HICAMP architecture), the use of an iterator register conveniently provides "snapshot semantics". For example, a single reference in the iterator register to the root of an in-memory data structure effectively provides a self-consistent snapshot of the state of this data structure at the time the root is loaded from memory to the iterator register. This representation ensures that a selected data structure (e.g., the data structure having its root loaded in an iterator register) does not change between the above-mentioned first and second loadings (i.e., access to a consistent data structure state is ensured). This concept extends to any number of memory load operations.

For memory store operations, a key aspect of the present approach is that local state can be built up relating to a pointer-linked data structure by performing one or more register operations involving pointers in the pointer fields of the iterator register. Throughout this specification, "local state" may refer to any state in the iterator register, including stored state within its pointer fields or other memory elements in the iterator register. Memory store operations can then proceed by way of updating memory contents according to this local state. For example, a pointer-linked data structure in memory can be initialized or updated according to this local state. An important feature of this approach is that memory store operations can be made atomic, such that all changes to an in-memory data structure can be made with a single machine-level instruction. In some embodiments, the in-memory representation of pointer chains is compacted. In these embodiments, the non-compacted pointer representation can be translated to a compacted representation, as part of memory store.

FIG. 1 is a block diagram of an embodiment of the invention. In this example, a computer processor 102 includes an arithmetic/logic unit (ALU) 104 and a register bank 110. Some of the registers in bank 110 are labeled as 112, 114, 116, 118. The registers of register bank 110 are iterator registers as described above. Processor 102 is in communication with memory 106, which can include any combination of main and/or cache memory. As indicated above, memory load operations entail transfer of data from memory 106 to register bank 110, while memory store operations entail transfer of data from register bank 110 to memory 106. An expanded view 120 of iterator register 118 is shown on FIG. 1. This view shows fields within the iterator registers. More specifically, a first field 122 provides storage for a first pointer P1, and a second field 126 provides storage for a second pointer Pn. Optionally, one or more additional pointer fields 124 can be present in the iterator register that provide storage for one or more additional pointers. The two or more pointers stored in pointer fields of an iterator register form a pointer chain as described above that leads to a data element E. In a preferred embodiment, iterator registers include a field 128 to provide storage for data element E, but this is not required. Storage for data element E can be provided elsewhere within the system (e.g., in memory 106, either in main memory or cache memory).

In some embodiments, a computer system is extended with a specific set of registers in each computer processor, designated as iterator registers. Each iterator register is designed with knowledge of the in-memory data structures used by the software, and is thus able to provide efficient positioning of access, loading of data, storing of data and modification to the data structure as well as atomic update.

In an embodiment, the architecture supports representation of a variable-sized array using a directed acyclic graph (DAG). A specific item in the array can be accessed by traversing from the root of the DAG to the leaf node corresponding to the designated offset. By maintaining a quasi-balanced representation, the cost of access can be bounded to be proportional log(N) levels, where N is the number of elements in the array.

In this embodiment, when an iterator register is loaded as a register referring to an array, it loads the intermediate nodes (i.e., a pointer chain) in the DAG from the root to the designated leaf in the DAG. Consequently, a subsequent load of the datum at the designated offset in the array can be accessed in a single memory access, namely in the portion of the leaf node identified when the iterator register is loaded. All this state can be transferred from one iterator register to another as a single iterator register move instruction.

Repositioning of an iterator register within an array is also efficient because it can reuse the intermediate nodes it currently has loaded if the new position is close to the current position. A common case is in fact moving the iterator register to the next datum in the array. In particular, in an embodiment, the iterator register supports post auto-increment in combination with accessing a datum through the iterator register. This increment automatically moves the position by the size of the array data elements. Moreover, an auto-increment iterator access can set the condition codes according to whether the iterator has reached the end of the segment/array, eliminating the need for a separate test for this condition. Finally, in an embodiment an iterator register can prefetch the data at the new position of the iterator register, if the iterator is not passed the end of the array.

For example, consider the simple case of vector addition as represented below:

```
for(int i = 0; i != max; ++i){
    vec2[i] = vec0[i] + vec1[i];
}
```

In a preferred embodiment, this code would be translated into the following pseudo assembly code:

```
        loadIterator ir2, vec2;
        loadIterator ir1, vec1;
        loadIterator ir0, vec0;
        b testLoop;
loop:
        load r1 @ir0++
        load r2 @ir1++;
        add r1,r2,r0,
        store r0 @ir2++
testLoop:
        bnz loop; // check if done
        continue:
```

Here, @ir0++ indicates access to the datum at the current location of iterator register ir0, with "++" indicating that the iterator position is to be moved to the next data, i.e. auto-incremented. Thus, accessing each datum and moving on to the next element can be embedded in a single machine instruction not tens or more, as required with a conventional architecture. Moreover, the "++" on an iterator register causes it to traverse the DAG to the next location, taking full advantage of the intermediate nodes that it already has loaded. Moreover, an iterator register can recognize sequential access and prefetch next nodes in the DAG in anticipation of need.

Iterator Load Algorithm

An iterator is loaded by specifying the root of the DAG and an offset within the array represented by the DAG. The iterator state is then loaded as follows:

```
loadIterator( root, offset ) {
    current = root;
    residualOffset = offset;
    while( not at the leaf ) {
        load node corresponding to current
        current = current[node(residualOffset)];
        residualOffset = residual(residualOffset);
        if( current is null) {
            set error flag
            break;
        }
    }
    if( residualOffset within leaf line ) {
        save residual offset
        save direct pointer to leaf line
        if(!writeonly) save datum at leaf line
    }
    else set error flag
}
```

In an embodiment, the iterator register avoids re-loading nodes to which it already has access. It also supports move of the state or a subset of the state between iterator registers.

Iterator Increment Algorithm

A similar procedure can be implemented to handle incrementing of the iterator register position, except the iterator register checks whether it already has the desired line loaded.

In an alternative embodiment, the iterator register first checks, on increment, whether the new position is in the current leaf line, and if so, just updates the residual offset. If not, it backs up to the internally managed line that points to this leaf line and checks if this internal node contains a pointer to the leaf node that corresponds to the new offset, loading that leaf node direct if so. If not, it recursively backs up to the next level interior node until it finds a common subroot that is on the path to the new offset. In the worse case, it backs up to the root node of the DAG.

On increment, the iterator register may prefetch the datum at the new location.

Benefits with Sparse Data Structures

The previous example using a dense array is not fully compelling because comparable code could be used on a conventional architecture, assuming the arrays are represented as linear sequences in memory. However, in that setting, growing the array to accommodate additional elements typically requires copying the entire array to a new location, incurring a significant copy cost.

With the present invention, the same basic code sequence can be used to handle a sparse array, as can be efficiently represented by a DAG in a HICAMP architecture (as described in greater detail in above-cited U.S. patent application Ser. No. 12/011,311). In this case, the "inc" instruction automatically skips over the "holes" in the array, as designated by null intermediate nodes. That is, the entries corresponding to zeroes or null pointers are not explicitly stored but represented by a null sub-DAG in some intermediate node. By skipping a null sub-DAGs, the iterator effectively skips over potentially large ranges of null or zero values.

In an embodiment, the iterator register also maintains an indication of the current offset of the iterator within a given array. For instance, an iterator register may be pointing at the 100,000th entry in a sparse array even though there are only 3 non-zero entries prior to this entry in the array. In this vein, there is some additional logic to add to the above to ensure that the three iterator registers are at a common position on each iteration, but no additional memory accesses.

In the case of a sparse array with the present invention, the single instruction to access a datum and to increment an iterator register contrasts with the tens of instructions required in conventional software to deal with the complex sparse array data structure and advancing an iterator construct through this data structure.

Similar benefits apply for storing values indirect through the ir2 iterator register above, particularly for a sparse representation. In particular, the iterator register can directly identify the location to update, based on it having retrieved the intermediate nodes of the corresponding DAG. In a sparse representation, writing an entry may entail modifying the DAG structure itself, to add, expand or remove subgraphs. The iterator register can perform these actions automatically based on the knowledge of the DAG structure, exploiting the interior node state it has loaded. Moreover, an iterator register can hold modified state of some intermediate nodes, reducing the frequency at which modifications are written back to memory.

Handling an Associated Array

In a preferred embodiment, each value has a unique representation as a DAG, as arises in HICAMP with its deduplication and canonical representation of DAGs. In this embodiment, a key that is larger than an array index can be represented as the unique address of the DAG storing this key. Then, this address can be used as the array index in a sparse array. For example, to implement an associative array keyed on a character string, each entry is stored in the array at the offset corresponding to the address of the DAG corresponding to character string key. In this case, a load of the entry at the key specified by a given string is accessed by positioning the iterator register for this array at the offset in the array corresponding to the address of the key and then performing the load. Consequently, access to an associative array requires a small number of instructions and has the memory references reduced substantially by the iterator register state, while the DAG structure ensures a worst-case memory reference overhead of order of log(N), where N is the number of entries in the array.

Software Iterator

It is common practice in software to use an iterator construct to access members of a software collection. For example, in C++ using the C++ Standard Template Library, processing all the members of a map collection integers indexed by strings can be written as follows:

```
typedef map mapType;
mapType map;
for(mapType::iterator i = map.begin( );i!=map.end( );++i) {
    ...
}
```

Similar constructs are available in other modern programming languages, including Java and C#.

In an embodiment, a software iterator can be translated into machine code that uses an iterator register to represent the iterator when the collection is implemented as a data structure supported by the iterator register. With this translation, the access to the collection is more efficient because of fewer memory references and more informed prefetching. The size of the machine code required to implement the processing is also substantially reduced compared to conventional machine code without the benefit of the iterator register.

Similarly, it is common practice for an optimizing compiler to translate an iteration over elements of an array into loading a pointer to the start of the array and then incrementing the pointer for each element of the array. An optimizing compiler can similarly translate conventional array indexing into an iterator register, using the indirect addressing with auto-increment to efficiently access each element of the array.

Snapshot Isolation

In an embodiment such as in HICAMP where memory is effectively immutable, an iterator register provides a logical snapshot or consistent copy of an array at the time that the iterator register is loaded. In particular, by the iterator register maintaining a reference to the root of this array representation, it retains a copy of the array at the time it was loaded. Consequently, iteration over the array returns exactly those elements of the array that were present at the time the iterator register was loaded.

In contrast, conventional iterators either incur the cost of a physical copy of the collection, a page-level copy-on-write if the collection can be page-aligned, or else expose the process iterating over the collection to concurrent changes to the collection, sometimes with undefined behavior.

In an embodiment, an iterator register can support a conditional reload operation, where it loads its state from a designated segment, optimizing the operation to avoid any action if the segment has not changed since the last (re)load. In particular, in a HICAMP embodiment, the reload operation can terminate reloading a subDAG at the point it detects that the previous id for the root of the subDAG is the same as the current one. In the case of no changes to the DAG, the root id for the current and previous DAG match, causing the operation to take no action.

Atomic Update

In some cases, it is desirable to support an atomic update of a data structure upon completion of a number of operations. Continuing the above example, it may be desired to be able to provide an atomic update of the "vec2" array only after the entire vector addition has been completed. In an architecture such as HICAMP, vec2 would be represented as a reference to a DAG. Here, the iterator register can hold references to the modified DAG and only update this vec2 root reference once the vector addition has completed. Moreover, by holding this modified state, a multiple operation sequence on a data structure can be aborted with no changes being reflected to the data structure.

In an embodiment such as HICAMP, the iterator register maintains an indication of the previous segment contents as well as containing (references to) the modified segment contents. In the case of HICAMP, this entails recording the physical id of the root of the DAG representing this original segment at the time the iterator register is loaded. In this case, an iterator register can support an atomic conditional update, conditioned on the original segment not having changed since the iterator register was loaded. This mechanism thereby provides an atomic update means that further detects when the array has been changed by another concurrent process during the processing of the first process. If it detects that another concurrent update has taken place, the process can retry the operation (as is typically for non-blocking synchronization approaches) or report a failure.

This facility is effectively the compare-and-swap functionality provided in the form where the iterator retains the old value for the "compare" action. This facility together with the above snapshot semantics provides so-called snapshot isolation semantics, as supported in certain database management systems as an alternative to the SQL lock-based isolation levels.

In an embodiment, a segment can be designated as supporting merge-update (as per provisional application 61/273,178, filed on Jul. 31, 2009 and hereby incorporated by reference in its entirety). In this case, the atomic conditional update or commit can detect the conflicting update by the above comparison between current and old version and then attempt to merge these two copies of the array, providing a failure indication if it is not able to handle it. In this case, the iterator register can provide the state to recognize the previous, current and new versions as well as optimized mechanism to merge the modified segment when this is possible.

Transient Line Management

In a preferred embodiment, the structured memory system ensures that units of memory, referred to as lines in HICAMP, are immutable. Consequently, modification to a data structure entails locating or allocating a separate line in memory that contains the desired data.

A line may contain multiple words of memory. Thus, in a typical sequential update to an array, a single line may be written multiple times before the updates move to the next line. In this embodiment, the iterator maintains the transient line state, avoiding the need to determine a revised immutable line after every store, deferring the register state is explicitly committed or the system has no more transient lines to allocate.

In an embodiment, some of the complex actions of an iterator register such as changing the DAG can be implemented by firmware executed by the processor rather than in circuit-encoded logic. The same benefits accrue if this firmware does not incur extra memory references.

Compacted Memory Representation

In a preferred embodiment, the DAG may be compacted in memory in various ways. For example, with a conventional binary DAG, the representation in memory may store 4 or 8 or more links to other nodes in the case where the addresses of these nodes can fit into one node. This compaction reduces the space overhead and also reduces the path length through the DAG to data at the leaf nodes. However, it introduces extra complexity in modifying the DAG. In this embodiment, the iterator register expands the compacted representation on loading of a segment, updates the representation in the expanded form in its internally managed state and then writes back the updated version in a compacted form once the updating has been completed, such as a commit of the changes. In this way, the DAG manipulation is not complicated by the compaction yet the storage overhead and the time and number of memory accesses to load and store the DAG in the iterator register are minimized. Further details relating to compaction are given in section C below.

Protected Memory References and Protected Data Structures

In an embodiment, memory references are protected in the sense that software cannot generate a new reference to memory except by receiving an existing memory reference or as part of allocating a new memory area, and memory cannot be reallocated until all references to a memory segment have been removed. Thus, conventional pointer arithmetic is excluded and a software process cannot have dangling references or access to data it has not been given access to. The HICAMP architecture is an example of such a system.

In this embodiment, the processor can be restricted to only allow access to memory using indirection through an iterator register and only update the associated DAGs using an iterator register. The iterator implementation can ensure that software can only load an iterator register with a valid reference to an existing DAG or the null DAG, and that all updates through the iterator register preserve the integrity of the associated DAG, the memory references and the memory system in general. Thus, not only are the conventional problems of memory overwriting and dangling pointers avoided, but the integrity of the DAG structures representing arrays, associative arrays, maps, etc. are ensured.

Furthermore, in an embodiment, an iterator register can indicate whether the software is allowed to store through the iterator or only load data, i.e. read only. This protection capability can reflect of the software notion of "const" into the hardware, providing true protection of the data against unauthorized modification.

Energy-Efficient Operation

In an embodiment, a processor provides a significant number of iterator registers, taking advantage of the large number of gates available in modern process technology. Here, each iterator register provides a control register that allows software to indicate whether the register is off, on or in standby mode. When off, the iterator register consumes little or no chip power. When set to on, the iterator register is fully functional, supporting loads and stores and handling prefetches and write-behind. In standby mode, the iterator register returns its current state but is otherwise passive, non-functional and consumes minimal power. A group of iterator registers can also share the DAG Assembly/Traversal/Compaction/Expansion logic to minimize the consumed power and area.

In this embodiment, the compiler generates actions to modify the operating state of the iterator registers. For example, additional iterator registers are enabled when the processor executes a matrix multiplication procedure, where there is a need for 2 iterator registers per matrix for a total of 6 iterator registers just for this operation, possibly others to access ancillary objects. Even more iterator registers could be advantageous in more complex computations. On the other hand, in the case of executing a procedure that is invoked as part of the iteration over a collection, the iterator register for the collection can be set in standby while this procedure executes, retaining its state yet reducing the consumed power. Finally, during other execution, most of the iterator registers can be turned off. Register allocation as part of program compilation is well-established in the art. The same mechanisms can be used to determine at compilation time the number of iterator registers required by a particular subroutine, facilitated by the fact that the memory access points in the program are known to the compiler. Thus, the necessary actions to control the iterator registers can be determined at compile time. At run-time, the software can simply issue an instruction to change the operating mode as required. To minimize the latter actions, the compiler can use of the convention of keeping some small number of iterator registers on as the common case requirement, and only enabling more during memory-intensive actions, such as matrix multiplication.

The disabling of all but the needed set of iterator registers can also save on the overhead of context switches, given that the operating system need not save the state of iterator registers that are turned off.

As another element of energy efficient operation, an iterator register can maintain some of its state in the processor cache or even in memory, rather than storing it all internal to the processor.

As further benefit to energy efficiency, the use of the iterator register leads to more compact code, fewer and more predictable memory references for accessing data in sparse and associated data structures, and thus fewer energy-expensive memory operations and cache misses.

Extended Instructions

In an embodiment, the processor can provide additional instructions that are specific to iterator registers, including:
a) comparison between iterator registers, determine DAG or subDAG equality and to determine whether a given sub-DAG is non-null.
b) expanding or contracting the height of a DAG, corresponding to changing the index range supported by the corresponding array.
c) extracting a sub-DAG
d) treating a DAG representation of a matrix as its transpose.
e) combining/appending two DAGs from two different iterator registers into one.
f) Replacing left or right sub-dag at a given height in one iterator register by left/right sub-dag at the same height in another iterator register.
g) Convert: converting all transient lines into permanent, de-duplicated lines without committing it to memory. This may be necessary when one wants to get the root PID of a DAG, without committing it to memory.
h) Comparison between two sub-dags at a given level in the same iterator register.
i) Conditional reload (as described above): reload the segment if the root PID of segment has changed.

These extended operations allow software to efficiently use the state of iterator registers as part of complex operations such as operations on sparse matrices as well as string manipulation.

Benefits

In general, by holding the additional data structure state, an iterator register supports efficient reading and supports the common read-modify-write cycle with atomic update semantics, providing efficient and safe execution in a parallel execution environment while reducing the number of machine instructions required to express common software patterns, such as iteration over elements of an array.

Thus, the benefits include:
a) efficient data load/store for software data structures that is concurrency safe.
b) better use of instruction-cache because of more concise instruction sequences particularly with auto-increment tied to size of iterator elements.
c) greater energy efficiency by fewer cache misses, stalls, etc.
d) means to enforce protected references, if memory can only be accessed through an iterator register.

In some embodiments, iterator registers are particularly useful in combination with the above-reference HICAMP architecture. Iterator registers are used for accessing allocated segments of memory that are represented as DAGs. They are the only registers that can be used for accessing memory in the HICAMP architecture. Each iterator register contains all the information about the memory segment being accessed, such as its Segment ID, height of the DAG and current offset. In addition, it also caches the path within the DAG to the leaf block that contains current offset. In one embodiment, the iterator register caches more than one path in the DAG, pointing to different data elements within a given segment. This effectively reduces number of memory accesses, particularly when accesses to segment are not sequential. Iterator registers can be used for both reading and writing memory segments. The following describes the details of the information within the iterator register and the operations they support, including memory Load and Store using an iterator register. The following terms are useful in describing the use of iterator registers in connection with HICAMP, which is described in detail as one example of the use of iterator registers:

Line (node): Basic element of memory allocation. Contains two 64-bit or more elements and a few flags that indicate the type of the values stored in the elements. The number of elements depends on the size of the line which may be 16 bytes, 32 bytes or larger.

PID (Physical line Identifier): The identifier used to access a specific line in the memory system. Its usage is very much like the memory address in the conventional architectures. However, due to the duplicate suppression in the memory system it is guaranteed that each PID has unique content.

Root: Is the special PID that sits at the top most level of the DAG. All the physical lines comprising a memory segment can be accessed by following the root PID and traversing the segment DAG.

Leaf node: Is the physical line that sits at the very bottom level of the DAG, containing the user data. Its level is usually referred to as level zero.

Internal (Parent) node: Is a physical line that does not contain data, but contains PIDs that point to the lower sub-tree. Nodes at level root down to level before leaf nodes are considered as internal nodes.

Fields

Figure 2:
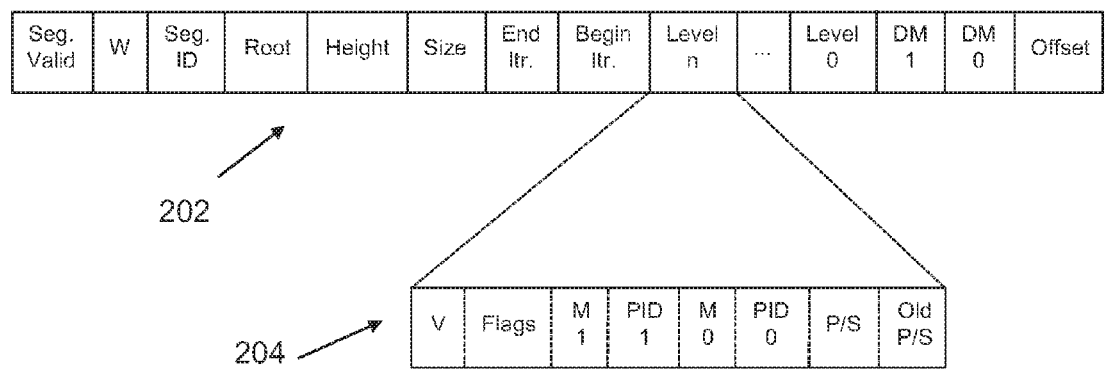
FIG. 2 shows an exemplary iterator register organization for use with an embodiment of the invention.

In the example shown, each iterator register has the following fields, as shown on FIG. 2 (202 on FIG. 2 shows the entire iterator register, while 204 on FIG. 2 shows the fields pertaining to one of the pointer levels of iterator register 202):

SegValid: A flag that indicates whether the register contains a valid segment ID.

SegID: (virtual) segment ID. Identifies the segment of the memory (or object) for the application.

W (Writable): Specifies whether the iterator register can be used to write the memory segment. If this flag is not set, only Load instructions may use the register to read the memory. Executing a Store instruction generates an exception.

Root: PID of the root node of the DAG. The value represents the original root PID that is loaded into the register after loading a new segment ID. This value is not used for the regular operations of the register (the PID of the level LHeight is used instead) and is primarily used to provide the old value for performing Compare-And-Swap (CAS) operations when updating segment mapping.

Height: Specifies the height of the DAG which implements the memory segment in number of levels. It is determined by the size of the allocated memory segment.

Size: Specifies size of the elements that are read/written through the iterator register (8, 16, 32 or 64 bit elements).

End Iteration: A flag that indicates whether or not iteration over the elements in the memory segment has reached its end. It prevents the segment offset from being increased beyond the end of the segment.

Begin Iteration: A flag that indicates whether or not backward iteration over the elements in the memory segment has reached its end (beginning of the segment). It prevents the segment offset from being decreased beyond the beginning of the segment.

Level Info: Contains the information about each of the levels in the DAG that are cached inside the iterator register, namely:

V: Valid, Indicates there is valid PID1/PID0 stored for this level. All levels above the root have their Valid flags set to zero to indicate that there is no PID for these levels (PID of root is stored in PID0 of level LHeight).

Flags: Flags for the PIDs stored at this level. Specifies any compaction of pointers or data values.

PID0/PID1: The physical line IDs for lines at this level. Level 0 represents the leaf nodes, while level n represents the root of the DAG for a segment of size S ($2n-1<S<=2n$). PID of prefix line is stored in PID0 and PID of suffix line is stored in PID1.

M0/M1: Modified flags used when writing through the register. Indicate that a new PID has been acquired and stored in the corresponding PID field, which has not been incorporated into the parent node yet.

P/S: Prefix/Suffix flag which indicates which PID at this level is currently active and is used for access to memory (zero for PID0, one for PID1).

Old P/S: Old Prefix/Suffix flag. When the P/S flag is updated in the register, the old value is stored in the Old P/S flag and is used for assembling new nodes if the segment is modified.

DM0/DM1: Data Modified flags. They operate the same as M0/M1 flags for each element in the Level Info, but only apply to the leaf node. For example, DM0 being one indicates that left leaf node has been modified and a new PID has to be acquired for it.

Offset: Specifies the offset within the current physical block. Concatenation of P/S bits from all the levels and this field {P/Sn, P/Sn-1, ... , P/S0, Offset} represents the offset within the memory segment. Combined with the size field in the register, it also identifies the current element within the segment (e.g. if segment is an array structure). In various embodiments, iterator register supports multiple paths in the same DAG simultaneously and contains multiple of the above fields, one for each such path. It is assumed that the iterator register can store the traversal information of all the levels of the DAG, even for the largest possible one.

The following describes the operations that the system can perform using iterator registers. To avoid confusion, read and write of the different fields in the register are referred to as Read and Write, while memory read and write operations using the register are referred to as Load and Store. It is assumed that there is an associated logic (e.g. an state machine) which monitors and potentially updates the fields in the iterator registers based on the instruction executed by processor. The discussion below distinguishes between the parts of the operation that are done in the processor pipeline (by executing instructions) and the parts performed by the associated logic.

Iterator Register Operations

Write Segment ID (Initialize).

This operation initializes the SegID, W and Size fields of the iterator register. It also sets the SegValid bit to indicate that iterator register points to a valid memory segment. All the V bits for all the levels are automatically turned off when a new SegID is loaded. Writing segment ID also turns off all the P/S bits in the register, effectively initializing it to the beginning of the memory segment. If the loaded root PID is zero indicating that segment is empty, both End Iteration and Begin Iteration flags are turned on. Associated logic starts acquiring internal PIDs and turning on the Valid bits down to the first leaf node, as described below.

Write Height.

The segment is always initialized with a given height that is extracted from the segment mapping structure. Writing the height field in the iterator register allows the segment size to be adjusted. Depending on the new and old values, the segment size can be increased or decreased. In each case, the Valid and Modified bits in the appropriate levels are changed to reflect the new segment size. Note that this operation is allowed only if segment is marked as writable. Assuming H1 to be the old value and H2 to be the new value of the Height field, changes in the Valid and Modified bits are described below:

If H2>H1 (segment size increased):
1. Set M0 flag in level H1 to one.
2. For all levels between H2 and H1+1 (inclusive) set PID1 field to zero and Old P/S flag to zero (leave valid bits as zero as well).
3. Set Valid flag for level H2 to one.

If H1>H2 (segment size decreased):
1. Turn off Valid flags for all levels between H1 and H2+1 (inclusive).
2. Set PID1 of level H2 to zero and adjust the flags accordingly.

Extract Sub-Tree.

As described above, writing the height field with a value less than its current amount results in decreasing the segment size. The resulting segment will only contain the contents from offset zero to the new size. By adjusting the current position that the iterator register points to within the segment before writing the height field, the new content of the segment can be adjusted to be any arbitrary sub-tree within the original segment. The changes to the Valid and Modified flags are similar to Write Height operation described above.

Write Offset.

Writes the segment offset (currently pointed position) of the iterator register {P/Sn, P/Sn−1, . . . , P/S0, Offset}. Lower bits of the offset are loaded into the Offset field, while the rest are loaded into P/S bits in each level. Before loading the new value into the P/S bits, current value of the P/S bit at each level is copied into Old P/S bit. (These bits are used for adjusting internal nodes of the DAG if the memory segment was modified before the offset change). The offset is properly adjusted according to the element size field (e.g. writing an offset value of 1 when the Size field indicates 64-bit elements actually results in writing an offset of 8). The Valid bits in each level are adjusted as follows (starting from the level LHeight−1):
1. If the valid bit Vi is zero, it remains zero.
2. If the valid bit Vi is one, current value of P/Si bit is compared with the new value that is being written.
3. If both values are the same, valid bit Vi−1 remains unchanged.
4. If values are not the same, valid bit Vi−1 is turned off and valid bits for all levels j<i−1 are also turned off.

Similar to the Write Segment ID operation, the associated logic observes the changes in the Valid bits and starts adjusting and fetching the internal nodes of the DAG into the PID fields in each level.

Read Offset.

This operation returns {P/Sn, P/Sn−1, . . . , P/S0, Offset} bits which indicate the current position that iterator register is pointing to within the memory segment. It considers the Size field when returning the offset and adjusts the returned value accordingly.

Move.

Similar to an ordinary register move operation, copies all the fields of one iterator register into another iterator register. If the iterator register is marked as writable, then the copy is also marked as writable. The destination iterator register is capable of reading the modified contents created by the source register before the move operation. However, if both registers are used for writing after the Move operation is completed, each has its own separate copy of the memory segment and is not able to see the changes made by the other register after the Move operation. In one embodiment, a move operation copies all the levels of the DAG, including the leaf to preserve snapshot semantics Move Constant.

Same as the above operation, but the Writable flag in the destination register remains zero (independent of the flag in source register). This creates a constant copy that is only readable via destination register. This implies that modifications in the source register should be finalized first (so that there are no transient or partially modified lines) before the fields can be copied to the destination register.

Compare SegID.

Compares the segment ID of two iterator registers.

Compare PID.

Compares Height and the current root PID of the two iterator registers (PID0 sitting at LHeight, not old root PID loaded form segment mapping structure). If both root PIDs at level Height are zero, the result of comparing the Height field is ignored. Hence, if two memory segments are zeros they are considered as equal independent of their size. This compare operation is always preceded by a Finalize operation to adjust the segment to the minimum necessary height before comparing the PIDs.

Compare Sub-Trees.

Compares the PIDs pointing to the two sub-trees at a given level for equality and determines whether the left and right sub-trees are the same. Note that unlike the above Compare PID operation, this operation is performed on the PIDs stored in the same iterator register.

Check for Empty.

Checks the current sub-tree at a given level to determine whether it is empty or not. If the root PID of the sub-tree is zero, the sub-tree is empty. If the level that comparison is performed is LHeight, it checks the whole DAG to determine whether it is empty or not.

Add Offset.

Adds a constant value to the segment offset {P/Sn, P/Sn−1, . . . , P/S0, Offset}. Exceeding the segment size is simply detected by a change in the P/S bit in LHeight. The addition considers the Size field of the segment before adding the operand to the current segment offset. For example, if the Size field indicates 16-bit elements, adding 18 actually adds a value of 36 to the current segment offset. Current values of the P/S bits in all levels are copied into Old P/S bits and Valid bits are adjust the same way as Write Offset operation: a change in the P/Si bit causes the Vi−1 and all Vj where j<i−1 to be turned off. Associated logic then starts fetching and adjusting new PIDs into the register. If the result of addition exceeds the segment size, the End Iteration flag is turned on and the offset saturates at the end of the segment.

Subtract Offset.

Similar to the Add Offset operation, but subtracts the value of the operand from the current offset. In case of underflow, sets the Begin Iteration flag and sets offset and P/S bits to all zeros.

Increment.

Increment operation proceeds to the next non-default element within the segment, starting from the current location. An important sub-operation for the increment is to find the next non-zero block within the DAG.

The steps for finding the next non-zero block are:
1. For all levels, copy the current value of P/S bit into Old P/S bit.
2. Traverse the levels backwards (L0 to LHeight) in the iterator register.
3. Find the first level which its P/S bit indicates that prefix (PID0) is active and the PID1 in that level is not zero (say level i), turn off all the Valid bits V0 to Vi−1 and all corresponding P/S bits.
4. Change P/S bit in level i to suffix.
5. If no such level can be found, then turn on End Iteration flag to indicate that register is at the end of iteration. Set all P/S bits from LHeight−1 to L0 to one and set Offset to all ones (effectively point to the end of segment)

From this point on, the associated logic starts fetching and adjusting PIDs into the iterator register again, but only loads the non-zero PIDs, as described in the next section. In addition to finding next non-zero block, the next non-zero element in the block should also be found and Offset field of the iterator register should be adjusted accordingly. A priority encoder can be used (in the L1 cache, for example) that provides the indicator for nonzero bytes in the current leaf node. This information can then be used to adjust the Offset field of the register accordingly.

Decrement.

Similar to the increment operation, decrements the segment offset and changes the current position to the previous non-default element in the segment.

Load.

The Load operation reads an element (according to the Size field) and returns the result (to a normal processor register). It checks the segValid flag and End Iteration/Begin Iteration indicators to ensure that segment is valid and not in the beginning or end of the iteration, generating an exception if any of the flags are active. Alternatively, there can be different Load operations, such as Load_Byte, Load_Word, etc. that access the memory in different granularity. Upon executing the load instruction, the appropriate PID in level 0 and the Offset field are provided to the memory system (or cache) to retrieve the desired data. P/S bit at level 0 indicates which PID to use for loading data. If the Valid bit in level 0 is off, then the Load instruction is stalled until the associated logic fetches and adjusts the internal PIDs of the iterator register.

The steps for the Load operation are as follows:
1. Check segValid flag, generate an exception if iterator register does not contain a valid segment.
2. Check Begin Iteration and End Iteration flags, and generate an exception if either one is active.
3. If Valid bit for level 0 is not one, stall until associated logic fetches the necessary PIDs and turns on Valid bits.
4. Read the leaf node using the current Offset field and return data.

Store.

The Store operation writes an element (according to the Size field) in the current position of the memory segment. Similar to Load operation, it checks the segValid, End Iteration and Begin Iteration flags. It also checks the Writable flag to ensure that segment is not read only. After completing the write of a leaf node and moving to next offset/element, the associated logic assigns a transient line ID (TID) to the line and adjusts the internal DAG nodes to reflect the changes. We assume that the write occurs to an already existing memory segment. If a new segment is created, it is initialized to all zeros by using zero PID in all the levels. The steps for executing a Store operation are as follows:
1. Check segValid flag, generate an exception if iterator register does not contain a valid segment.
2. Check Begin Iteration and End Iteration flags, and generate an exception if either one is active.
3. If Writable flag is not set to one, generate an exception.
4. If Valid bit for level 0 is not one, stall until associated logic fetches the necessary PIDs and turns on Valid bits.
5. Write the leaf node with given data.
6. Turn on DM0 or DM1 bit, according to the value of P/S0 bit.

Finalize.

This operation causes the iterator register to update all the nodes in the segment DAG by acquiring new PIDs for the leaf nodes all the way up to the root node. It also adjusts the segment height to the minimum possible value, i.e. it removes all unnecessary zero sub-trees from the segment such that both prefix and suffix sub-trees in the root are non-zero. This operation is performed by signaling the associated logic to acquire PID for any modified leaf nodes and adjust the intermediate PIDs appropriately. The operation stalls until all M1 and M0 bits in all levels are turned off, except the M0 bit in LHeight (Which is the PID of the root). Update of the segment mapping structure and any comparison between root PID of two segments should always be preceded by this operation.

Associated Logic

The associated logic with the iterator register monitors the Valid flags of all levels in the register and performs the following operations when necessary:
1. Assembly of the DAG, when leaf nodes with new contents are created.
2. Fetch and adjustment of the internal DAG nodes after changing segment offset.
3. Fetch and adjustment of the internal nodes leading to a non-zero leaf.
4. Compacting leaf and internal nodes while writing, if possible.

This section describes the necessary steps for completing above operations.

Assembly of the DAG.

When changing the segment offset in a iterator register that is marked as writable, if there is a modified leaf or internal node in the register (any of the DM0/DM1 or M0/M1 bits are set), the iterator register generates a new TID and stores it in the appropriate field in the parent node. Only after performing this step can the PIDs corresponding to new offset be loaded into the register. The assembly operation turns off the DM0/DM1 and M0/M1 bits in the register, but leaves the M0 bit at level LHeight at value one, indicating that a new root PID is acquired for the segment.

The steps for performing DAG assembly are as follows:
1. If any of the DM0 or DM1 bits are set to one, present the contents of the corresponding leaf node to memory system, acquire a new PID, store it in the PID0 or PID1 of level 0 and set the M0 or M1 bit accordingly (if DM0 is set, place PID in PID0 field and set M0 bit, if DM1 is set, fill in PID1 field and set M1 bit).

2. Starting from level 0, find the first level which has Valid bit equal to zero and an M0 or M1 bit set to one (say level i).
3. Combine PID0 and PID1 in level i into a new line, present it to memory system and acquire new PID.
4. Place this PID in appropriate location in level i+1 according to the Old P/S bit (PID0 if Old P/S bit of the above level indicates prefix, PID1 otherwise) and turn on the appropriate M bit.
5. Continue the operation to higher levels until the first set Valid bit is found (the sequence is guaranteed to stop since the Valid bit of the root is always one).

Fetching and Adjusting Internal Nodes.

The Valid bits of some of the levels in the iterator register might be set to zero due to executing an instruction that changes position in the segment, namely Write, Add or Subtract Offset. The associated logic monitors these Valid bits and fetches necessary internal nodes according to the new segment position. If the iterator register is used to modify memory, before adjusting pointers according to the new offset, new PIDs should be assembled and integrated into the DAG as described above.

The following describes necessary steps for updating internal nodes according to the new segment position:

1. Starting from level LHeight, find the first level where the Valid bit is zero (say level i).
2. Depending on the P/S bit in level i+1, present PID0 or PID1 of level i+1 to memory system to acquire the appropriate internal node contents.
3. Load the prefix and suffix pointers into PID0 and PID1 of level i correspondingly and set Valid bit Vi.
4. Continue the operation until valid bit of level zero is set to one and leaf node is loaded.

Fetching Non-Zero Nodes.

When incrementing (or decrementing) the offset to a non-default element, the associated logic only fetches non-zero nodes upon traversal to the leaf node.

The steps are very similar to the previous case:

1. Starting from level LHeight, find the first level where the Valid bit is zero (say level i). P/S bit in levels i to zero should point to prefix, while P/S bit in level i+1 should point to suffix. (Following the steps for Increment operation described in the previous section).
2. Present PID1 of level i+1 to memory system to acquire the appropriate internal node. This node is guaranteed to be non-zero.
3. Load the prefix and suffix pointers of the acquired node into PID0 and PID1 of level i correspondingly, set Valid bit Vi.
4. If PID0 in level i is non-zero, use it to acquire next internal node and load it into level i−1, set the Valid bit Vi−1.
5. Otherwise, set P/S bit in level i to suffix, use PID1 to load next internal node into level i−1, and set the Valid bit Vi−1.
6. Continue the operation until level 0 is loaded and its valid bit is set to one.

Compacting while Writing.

The segment DAG can be compacted as it is being written via the iterator register. Compaction can happen for both internal DAG nodes (PIDs) and for the leaf nodes that contain data.

Compacting Internal Pointer Nodes.

Assume that in the iterator register Vi bit as well as M0/M1i bits are set, indicating that physical line IDs are created and stored in PID0/PID1i. Whenever the offset is moved to another location in the segment (or when a finalize operation is performed) a parent node should be created for these two PIDs and placed in level i+1. At this point, the processor checks the two PIDs to see whether they can be compacted into a single 64-bit field (e.g., if each pointer uses only 32 bits, then such compaction is possible). In that case, instead of acquiring a new PID for the parent node, the two PIDs are combined into a single 64 bit field and are placed in the appropriate PID of Li+1 and adjusting FLGSi+1 accordingly. The details of this compaction is explained further in section C below.

Compacting Leaf Nodes.

Same compaction mechanism can be used for compacting leaf nodes. The difference is that the content in the leaf lines should be checked to see whether compaction is possible or not.

Compaction at Level 0—

When a line is created and the offset is incremented to move to the next physical line, a PID should be acquired for the created content. At this stage, the processor checks the contents of the created line to see if compaction is possible. There are three different compaction cases and a pruning case possible for a leaf node. Each byte in the leaf is checked against zero and a simple logic described in section C decides which compaction case should occur. If the leaf line is compacted, it is placed in the appropriate PID field of its parent and the FLGS field is adjusted to reflect that PID contains a compacted leaf line rather than a pointer to physical line.

Compaction at Level 1—

When a compacted node is to be placed in PID field at L1 and the PID field in L1 already contains a previously compacted node, the iterator register considers the possibility of further compacting the two nodes. In order to do that, appropriate bits of the two compacted L0 nodes are checked. If these bits are zero, then the two nodes can be further compacted into a single 64-bit value and stored in PID at L2. Section C describes the possible compaction cases and logic.

Compaction at Level 2—

Compaction at this level is very similar to the previous levels: when a compacted line exists in PID field of L2 and another such line is to be added, the two lines can be further compacted if the appropriate bits are zero.

Compaction at Higher Levels—

No more leaf compaction is possible at levels above 2, but pruning is possible at these levels. Section C describes the details of pruning at levels above 2.

Reading Compacted Nodes.

When loading a PID at a given level Li, flags of the loaded PID are checked to see whether it is compacted. As described, compaction can occur either for the internal DAG nodes or for the leaf nodes. If the flags indicate that loaded PID at level Li in fact is a compacted internal DAG node, then the PIDi value is directly extracted from PIDi−1, according to the P/S bit of level Li. If the flags indicate that the PID is a compacted leaf node, then the leaf is expanded according to the current PID level and flags which indicates how many elements exist in the compacted line. The expansion fills in the next level of the iterator register without requiring a memory access.

C. Compaction

This section provides further detail relating to compacting the DAG representation of the segment and reducing its storage requirements.

Line Compaction

Line compaction detects opportunities where data elements within a memory line can use less bits to represent their values and compacts these elements by removing the unused zero bits. In an embodiment a set of flags associated with each memory line encodes type and number of each data element contained in the line and allows the system to expand the compacted lines and extract original data elements when necessary. A DAG representation includes leaf lines that contain the actual data elements and parent lines which have pointers (PIDs) to leaf lines or other parents. Line compaction can be applied to both separately, as described below.

Compacting Leaf Lines

After creating contents for the leaf line by writing via the iterator register, DAG assembly logic in the iterator register acquires a PID for the created line and stores it in the parent line. At this stage, the iterator register considers the possibility of compacting the whole leaf line into a single element within the parent. Compaction can be applied to memory lines with different sizes, such as 16, 32 or more bytes. In an embodiment, each memory line includes two 64-bit fields with 4 bits of flag associated with each. These flags encode the type of the contents and number of data elements present in each 64-bit field.

Table 1 lists all possible cases of content type and element count for this example. P and S flags encode the type of the content stored, while W flag encodes number of elements. An x entry in this table indicates a "don't care" for the corresponding bit. Different encoding for the type and number of elements are also possible. In some embodiments with line sizes larger than 16 byte flags the size and number of elements in each half of the line may be encoded separately. For example, in an embodiment that uses 32 byte lines, each half line can contain one 128 bit element, two 64 bit elements, four 32 bit elements, eight 16 bit elements or sixteen 8 bit elements.

TABLE 1

Content type and number of elements for a
single 64-bit field in a given embodiment.

| P | S | W[1:0] | Contents | Description |
|---|---|--------|----------|-------------|
| 0 | 0 | 00 | 1 × 64-bit element | Data |
| 0 | 0 | 01 | 2 × 32-bit elements | Data |
| 0 | 0 | 10 | 4 × 16-bit elements | Data |
| 0 | 0 | 11 | 8 × 8-bit elements | Data |
| 0 | 1 | 00 | 1 × 64-bit element | Application-level pointer (Segment ID) |
| 0 | 1 | 01 | 2 × 32-bit elements | Application-level pointer |
| 0 | 1 | 10 | 4 × 16-bit elements | Application-level pointer |
| 0 | 1 | 11 | 8 × 8-bit elements | Application-level pointer |
| 1 | 0 | x0 | 1 × 64-bit element | Internal tree pointer (PID) |
| 1 | 0 | x1 | 2 × 32-bit elements | Internal tree pointer (PID) |
| 1 | 1 | xx | 1 × 64-bit element | Bit-Int representation ([63:56] encodes height, [55:0] encodes PID) |

Figure 3:
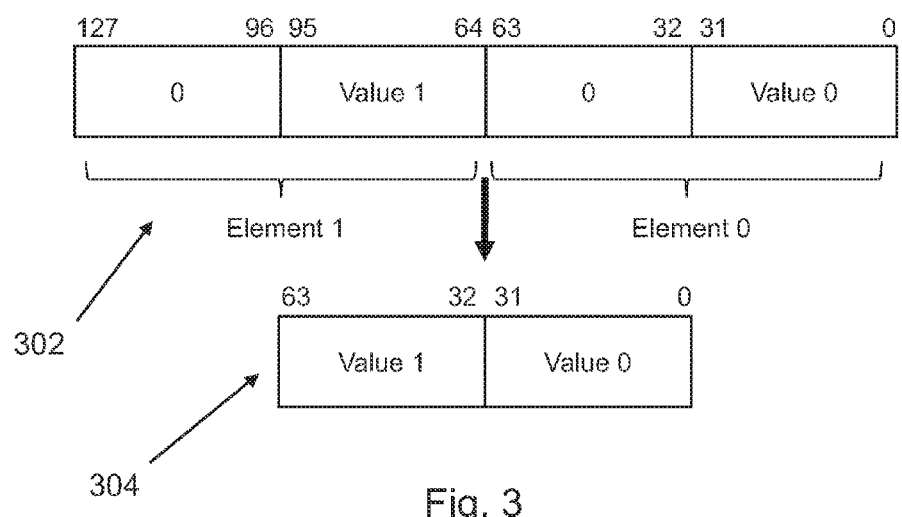
FIG. 3 shows an example of compaction of two 32-bit elements into a single 64-bit word.

In one embodiment with 16 byte lines, three different forms of compaction can be applied to the leaf lines that store data or application level pointers:

Case 1—Compacting two 64-bit elements (FIG. 3, 302 is non-compacted representation and 304 is compacted representation): If the line contains two data values or application-level pointers and the 32 most-significant bits of both elements are zeros, then each element can be stored using only 32-bits, allowing the whole line to be compacted as a single 64-bit value that has two 32-bit sub-elements. The resulting 64-bit value is then stored in the appropriate 64-bit field of the parent line.

Figure 4:
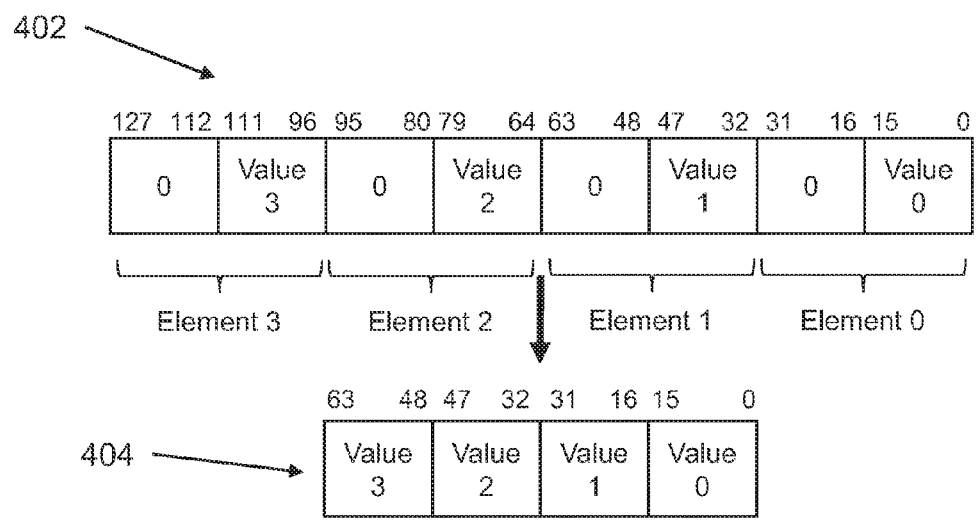
FIG. 4 shows an example of compaction of four 16-bit elements into a single 64-bit word.

Case 2—Compacting four 32-bit elements (FIG. 4, 402 is non-compacted representation and 404 is compacted representation): If the memory line has four 32-bit elements that are data or application-level pointers, and 16 most significant bits of all the elements are zeros, each element can be stored using only 16 bits, and hence the whole line can be compacted into a single 64-bit value stored in the parent line.

Figure 5:
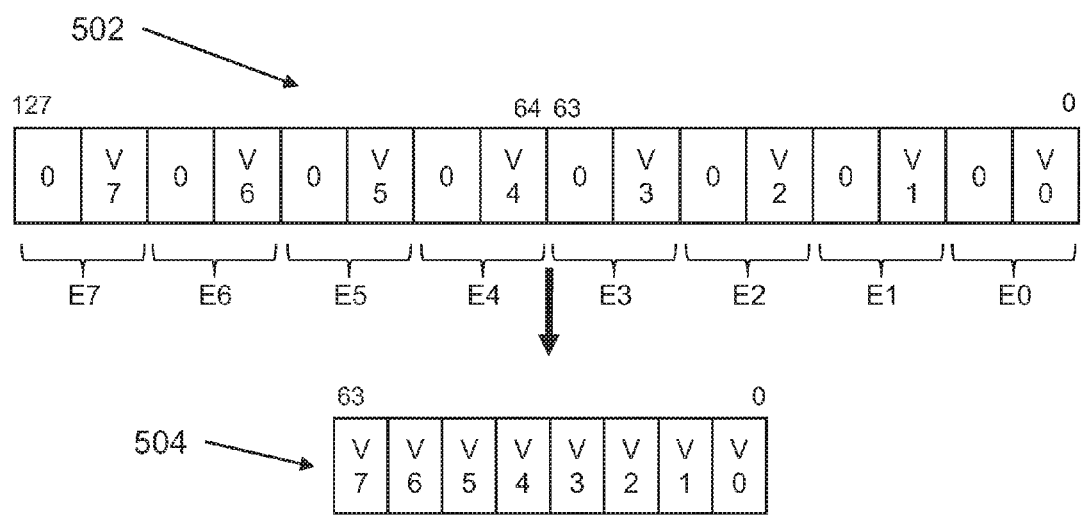
FIG. 5 shows an example of compaction of eight 8-bit elements into a single 64-bit word.

Case 3—Compacting eight 16-bit elements (FIG. 5, 502 is non-compacted representation and 504 is compacted representation): If elements in the original memory line contain data or application-level pointers and the 8 most significant bits of all elements are zero, each element then can be stored using only 8 bits and hence the whole memory line can be compacted into a single 64-bit value within its parent line.

More compaction cases are possible in embodiments with larger line sizes, where each case compacts a full line into a half line. For example, in an embodiment with 32 byte lines the compaction cases are as follows:

a. Case 1—compact two 128-bit elements
  b. Case 2—compact four 64-bit elements
  c. Case 3—compact eight 32-bit elements
  d. Case 4—compact sixteen 16-bit elements For detecting each of the above cases, a bit vector called Z can be defined, where $Z_i=1$ if $Byte_i$ contains all zeros. Each of the above compaction cases can then be detected by evaluating the following logic equations, where (&) represents logical AND operation:

$$\text{Case 1: } Z_{15} \& Z_{14} \& Z_{13} \& Z_{12} \& Z_7 \& Z_6 \& Z_5 \& Z_4 = 1 \quad (1)$$

$$\text{Case 2: } Z_{15} \& Z_{14} \& Z_{11} \& Z_{10} \& Z_7 \& Z_6 \& Z_3 \& Z_2 = 1 \quad (2)$$

$$\text{Case 3: } Z_{15} \& Z_{13} \& Z_{11} \& Z_9 \& Z_7 \& Z_5 \& Z_3 \& Z_1 = 1 \quad (3)$$

Different compaction cases can be evaluated independently and depending on the stored values within the memory line more than one compaction case might be possible for a given content. A specific embodiment then prioritizes which of the compaction forms to be applied first. In a preferred embodiment, if more than one compaction case is possible for a given line, the priority goes to Case 1, then Case 2 and only if the other two cases are not possible, Case 3.

Figure 6:
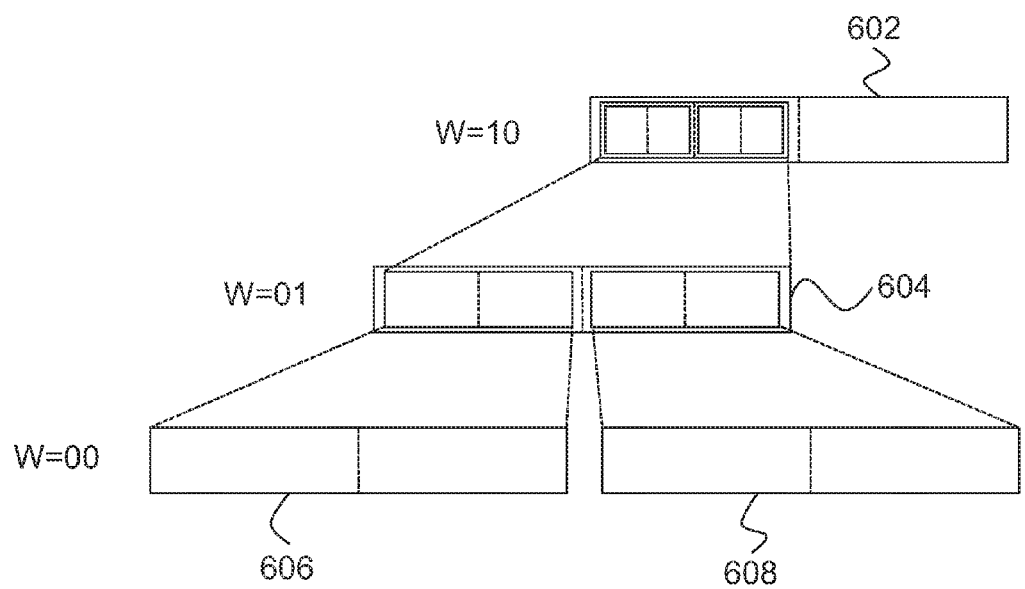
FIG. 6 shows an example of two levels of compaction.

A compacted memory line might be compacted once again, increasing number of sub-elements stored in the fields. FIG. 6 shows an example where a 16 byte line with two 64-bit elements (606 and 608) is compacted two times, allowing a single 64-bit field in the parent line 602 to accommodate data that was originally stored in two leaf memory line. 604 shows the result of a single compaction.

The actual compaction occurs inside the iterator register before the register attempts to acquire a PID for the created content. After compacting a memory line, the resulting value is stored in the appropriate field of the parent line and its flags are adjusted according to the compaction degree to indicate the number of elements that are placed in that field.

Compacting Parent Lines

Same compaction cases can be applied to parent lines that contain pointers to other lines (PIDs). Compacting more than one PID in a given field increases the degree of the DAG and hence reduces number of levels used, as well as number of parent memory lines necessary for forming the DAG.

Expanding Compacted Lines

Compacted lines can be expanded in the iterator register when the DAG is traversed to reach a leaf line. The iterator register checks the flags for each half of the line and if it detects that the field contains a compacted memory line, expands the field and generates the original memory line by inserting zeros in the appropriate locations, depending on the number of elements present in the field (as shown in FIGS. 3-5).

Path Compaction

Path compaction is another possible compaction case that is applicable only to the parent lines. In parent lines, each field contains a PID and hence points to another memory line. If the configuration of the memory system is such that PID values are encoded using less than a specified number of bits, the remaining (MSB) bits of each field can be used for implementing path compaction.

Figures 7A, 7B, 7C:
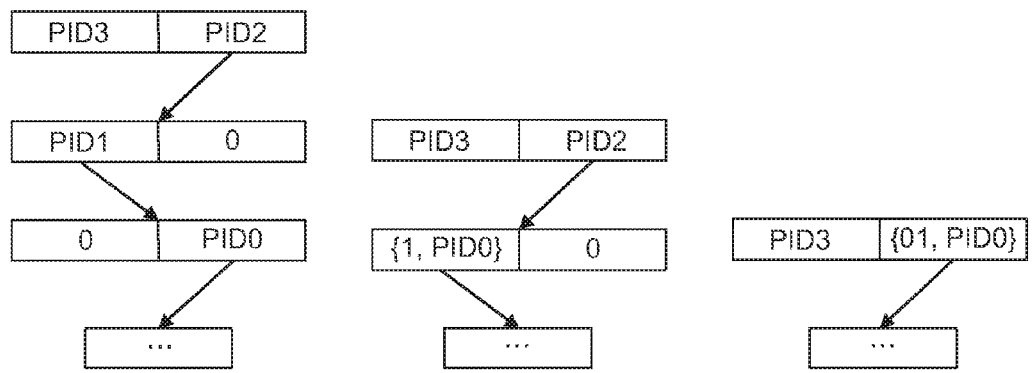
FIGS. 7a-c show an example of path compaction.

Path compaction is implemented as follows: When a line only has a single non-zero PID element (the other element is zero), instead of acquiring a new PID to be stored in its parent, the existing PID is pushed upwards into the above level and stored in the appropriate field of the parent line. The excess MSB bits in the field are used to encode the path that leads to this PID, as shown in FIGS. 7a-c. In this diagram, PID0 is path-compacted and pushed upwards in the DAG by two levels as one progresses from FIG. 7a to FIG. 7c.

In one embodiment with 16 byte lines, the bits that encode compacted path are inserted in to the unused most significant bits of the 64-bit element, one by one, at each level that after the PID is compacted. They are extracted one by one at each level at expansion time and dictate whether the PID is placed in the left or right 64-bit field of the child. In the above example, the path is encoded as the "01" bit string shown on FIG. 7c, which indicates that upon expansion, PID0 is first placed in left 64-bit field (first '0' bit of the path) and then in the right 64-bit field ('1' bit in the path).

Line Pruning

Pruning is applied to leaf lines where only the first field of the memory line contains non-zero value. In such cases, instead of creating a PID to place in the parent line, the non-zero field itself is directly placed inside the appropriate field in the parent line. Upon traversal to reach the leaf line, iterator register detects such pruned memory line and generates zero fields for the empty fields in the child line automatically.

Pruning Zero-Suffix Sub-Trees

Figure 8A:
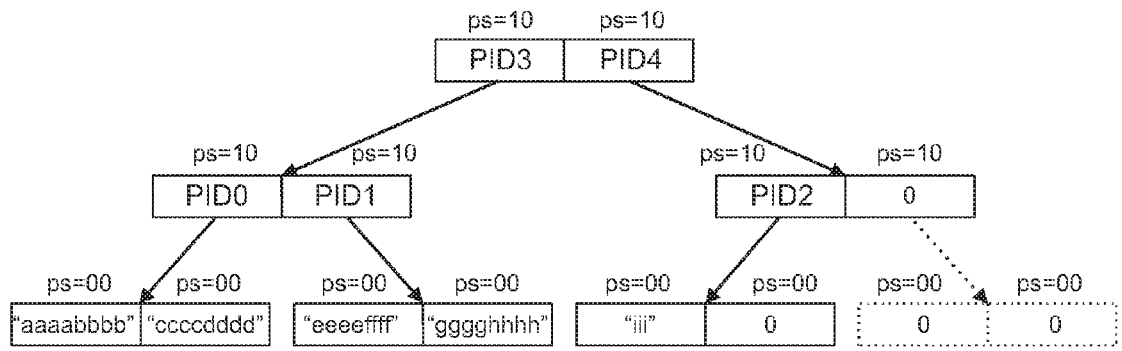
FIGS. 8a-b show an example of pruning zero suffixes.
Figure 8B:
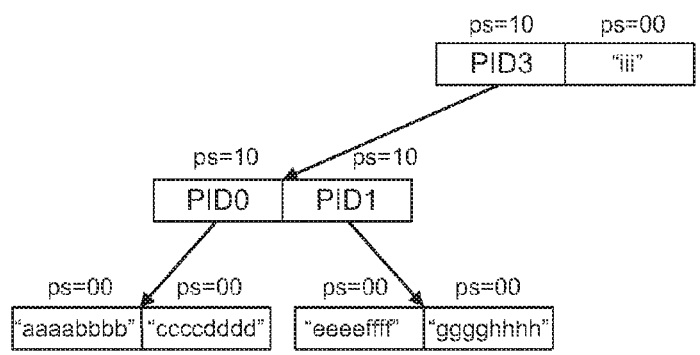

In cases where there is only a few non-zero data elements in the whole suffix sub-tree (of the root line), it is beneficial to "in-line" the data element of the suffix sub-tree in the root memory line directly, rather than storing the complete path to a leaf line. For example, for the strings where the string length is slightly larger than a power of two, the remaining characters can be in-lined into the root memory line itself. FIGS. 8a-b show an example of a 35-character string that uses pruning to save memory lines. Without pruning, the data structure is as shown on FIG. 8a, while after pruning it is as shown on FIG. 8b.

Pruning is only applicable to leaf lines that contain data or application level pointers. In an embodiment where each memory line has two 64-bit fields, using the Z bit vector defined earlier, the condition for detecting pruning possibility is:

$$\text{Pruning: } Z_{15} \& Z_{14} \& Z_{13} \& Z_{12} \& Z_{11} \& Z_{10} \& Z_9 \& Z_8 = 1 \quad (4)$$

In such embodiment, when doing the pruning, instead of acquiring a PID for the leaf line the first 64-bit field of the leaf line (which is non-zero), is copied to the first 64-bit field of the parent. In the preferred embodiment, if there are possibilities for both pruning and compaction for a given leaf line, then pruning is given priority, because it can potentially push the data upwards in the tree all the way to the root.

Algorithms

This section explains the algorithms for compacting and expanding memory lines at each level of the DAG for a preferred embodiment, such that it is guaranteed that there is no ambiguities and a given content always has a unique representation after being compacted. In this preferred embodiment, each memory line includes two 64-bit fields and each field has 4 bits of flag that encode the content type and number of elements in the 64-bit field, according to Table 1. These algorithms may easily be extended to cover additional compaction/expansion cases that are possible in larger line sizes.

There are separate rules for compacting or expanding memory lines at a given level of the DAG, as described in the following for one embodiment with 16 byte lines. The leaf lines of the DAG are indicated as level zero. In this preferred embodiment priorities for different cases of compaction are such that pruning has the highest priority and compaction Case 3 has the lowest.

Compaction/Pruning

The following described how to compact or prune memory lines at each level of the DAG. This algorithm is applied when iterator register assembles the DAG structure and acquires a new root for the DAG.

Level 0.

Figure 9:
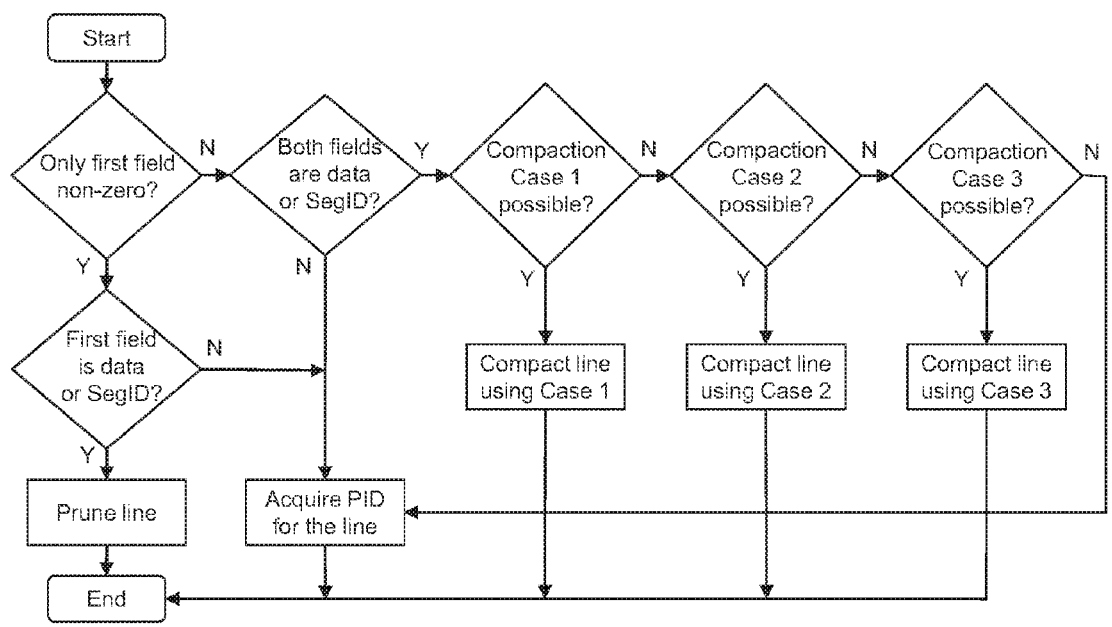
FIG. 9 is a flowchart for level 0 pruning/compaction.

By definition of the DAG, memory lines sitting at level zero are leaf lines that contain data elements. The flowchart in FIG. 9 describes how to compact or prune a memory line at this level. If the line is compacted, it is placed in a 64-bit field in the parent line and W bits of the flags are adjusted to reflect number of elements contained in that 64-bit field. For example, if line is compacted using compaction Case 2, the W flags for the destination field in the parent is set to W=10 to indicate that there are four 16-bit elements compacted in this field. Detecting possibilities for any case of line compaction or pruning is based on the logic equations (1)-(4) described earlier.

Level 1.

Figure 10:
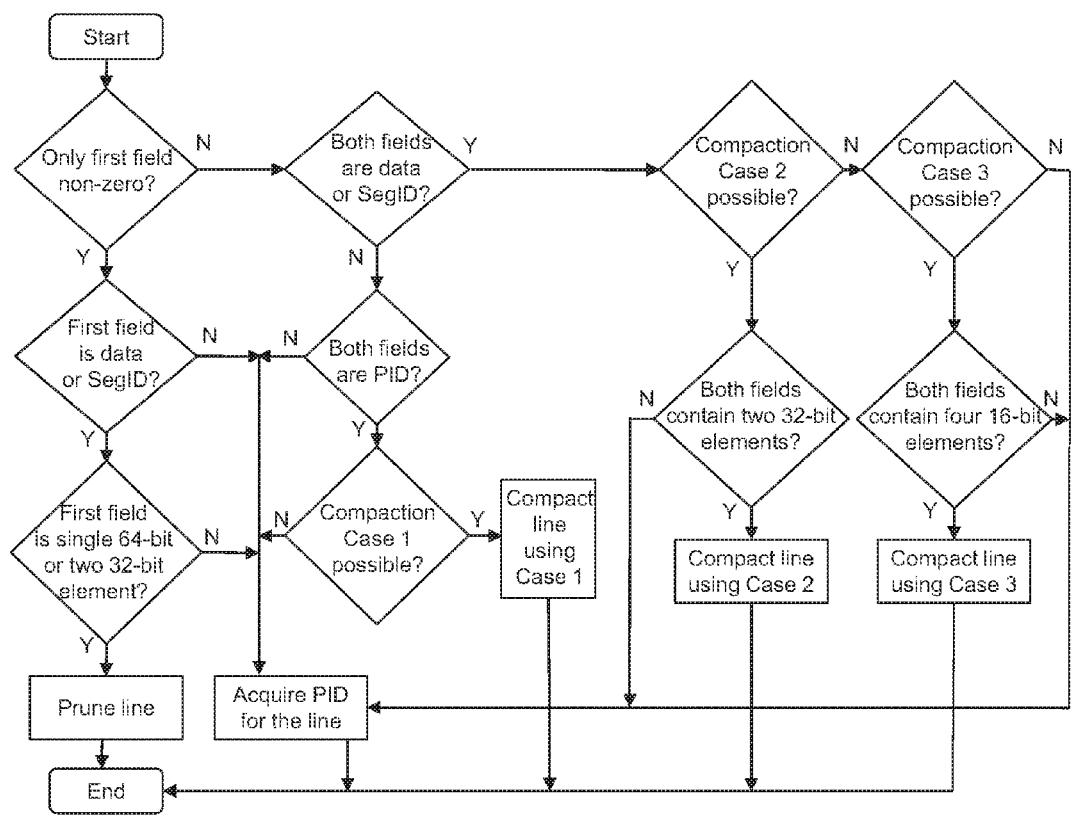
FIG. 10 is a flowchart for level 1 pruning/compaction.

FIG. 10 shows a flowchart for compacting memory lines at level 1. Lines at level 1 either contain PIDs or compacted Data/SegID values from level 0. The rules for compacting lines at this level expressed by the flowchart are:

Pruning is possible only if the first 64-bit field contains a single 64-bit element or two 32-bit elements.

Compaction Case 1 is applicable only to memory lines that contain PIDs in both fields.

Compaction Case 2 is applicable only if each 64-bit field in the memory line contains two 32-bit elements, i.e. compaction Case 1 is already applied in the lower level.

Compaction Case 3 is applicable only if each 64-bit field in the memory line contains four 16-bit elements, i.e. compaction Case 2 is already applied in the lower level.

These restrictions are to guarantee a unique representation for a compacted memory line, so that the expansion algorithm can determine how to expand the memory line to its original form without ambiguity.

Level 2.

Figure 11:
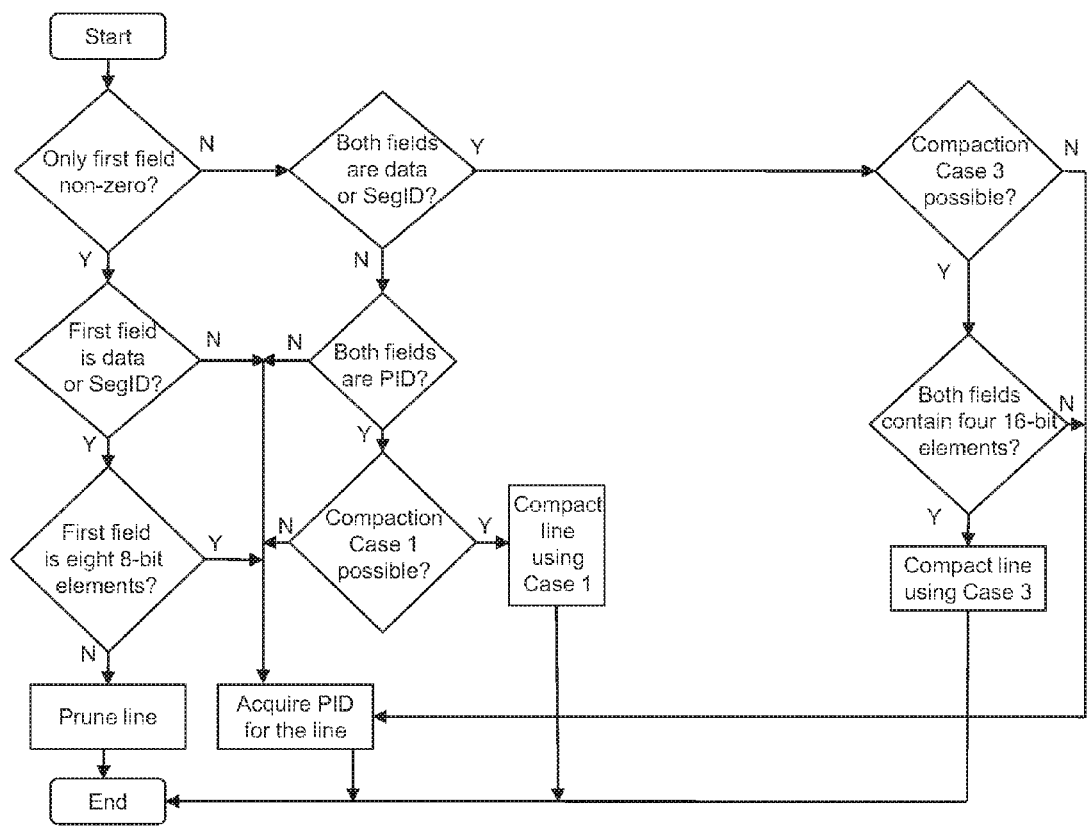
FIG. 11 is a flowchart for level 2 pruning/compaction.

Similarly, memory lines at this level contain either PIDs or compacted values from the levels below. FIG. 11 shows how different compaction cases are applied at this level. According to this diagram, rules for compacting lines at this level are:

Pruning is possible only if the first 64-bit field of the memory line contains a single 64-bit element, two 32-bit elements or four 16-bit elements (pruning is not allowed if first 64-bit field contains 8, 8-bit elements).

Compaction Case 1 is applicable only to memory lines that contain PIDs in both fields.

Compaction Case 2 is not allowed at this level.

Compaction Case 3 is applicable only if each 64-bit field in the memory line contains four 16-bit elements, i.e. compaction Case 2 is already applied in the lower level.

Level 3 and Above.

Figure 12:
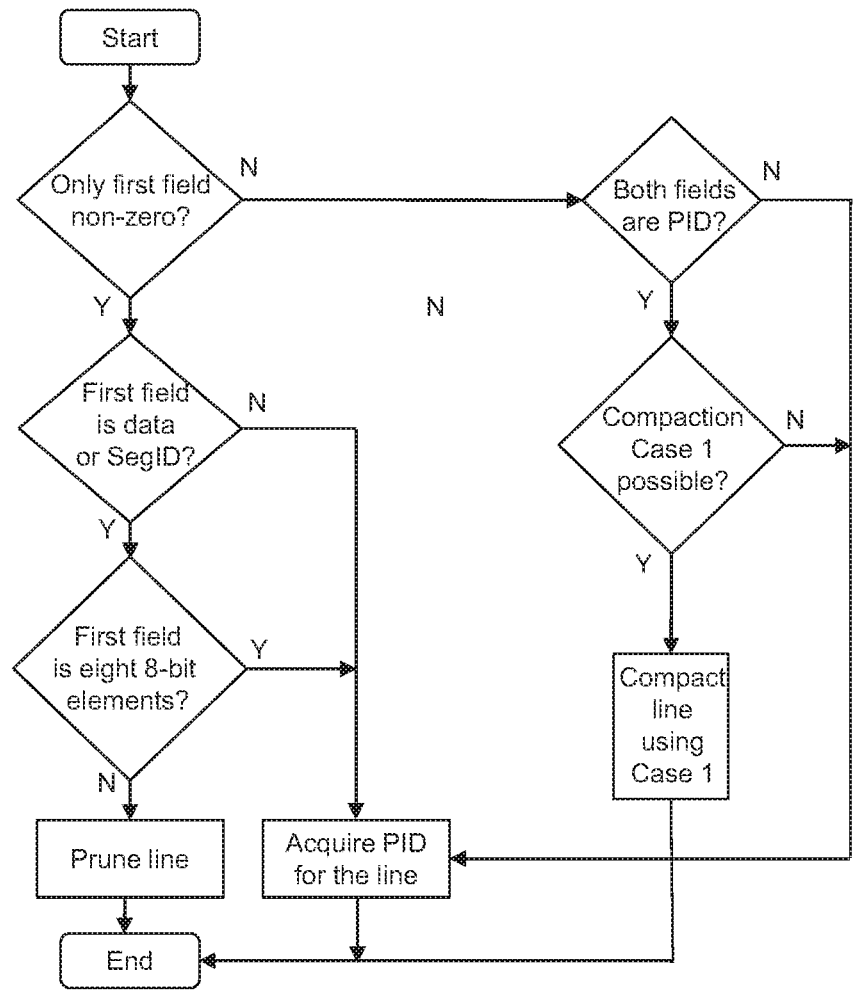
FIG. 12 is a flowchart for pruning/compaction at levels 3 and higher.

To prevent ambiguous cases, it is not allowed to compact lines at level three or above, but pruning can still be applied to lines that only their first 64-bit field is non-zero. The only exception is that PIDs can still be compacted at these levels using compaction Case 1. FIG. 12 shows a flowchart for compacting lines at level 3 and above.

Expansion

This section describes the line expansion algorithm and necessary steps for expanding compacted lines in order to convert compressed data elements into their original form. Compacted lines are stored in a 64-bit bit field of their parent line. The expansion algorithm considers each 64-bit field in the memory line separately and determines whether is contains a compacted line or not. For expanding a compacted line, appropriate bits of the expanded line are filled with zeros according to FIGS. 3-5. The expansion operation is performed in the iterator register. The content type, number of elements in the 64-bit field, and level that it is located provide the iterator register with enough information for detecting and expanding the compacted line. Compaction algorithm explained in the previous subsection guarantees that the expansion algorithm can retrieve the original memory line without any ambiguity. The following describes expansion rules for lines at each level of the DAG.

Levels Above 3.

Figure 13:
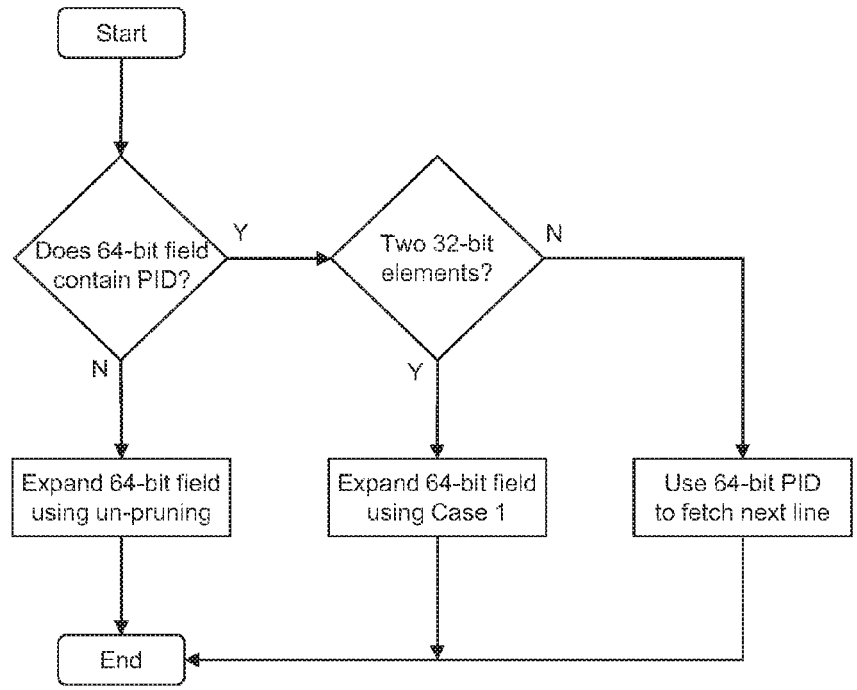
FIG. 13 is a flowchart for expanding a compacted line at levels above level 3.

As described in the compaction algorithm, no form of compaction is allowed for lines that are at levels above three, therefore no expansion is possible for such lines. The only exception is when the 64-bit field contains two 32-bit PIDs. In addition, pruning is possible for lines at these levels. Expansion algorithm detects pruned lines that are stored in a single 64-bit field of the parent line and restores them to their original form by simply copying the contents of the 64-bit field to the first 64-bit field of the expanded line, and filling the next 64-bit field with zero. FIG. 13 shows a flowchart of expanding a compacted line at levels above level three.

Level 3.

Figure 14:
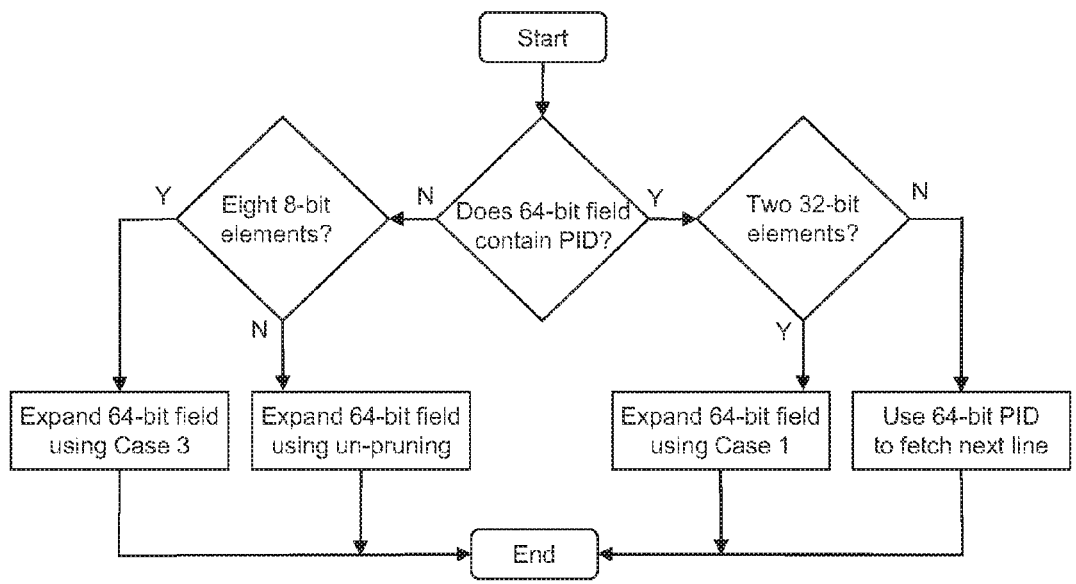
FIG. 14 is a flowchart for expanding a compacted line at level 3.

FIG. 14 shows a flowchart for expanding a compacted line that is at level 3. At this level, compacted lines that contain PIDs can be expanded using Case 1. Compacted lines that contain data or application level pointers can be expanded using Case 3 or alternatively can be un-pruned.

Level 2.

Figure 15:
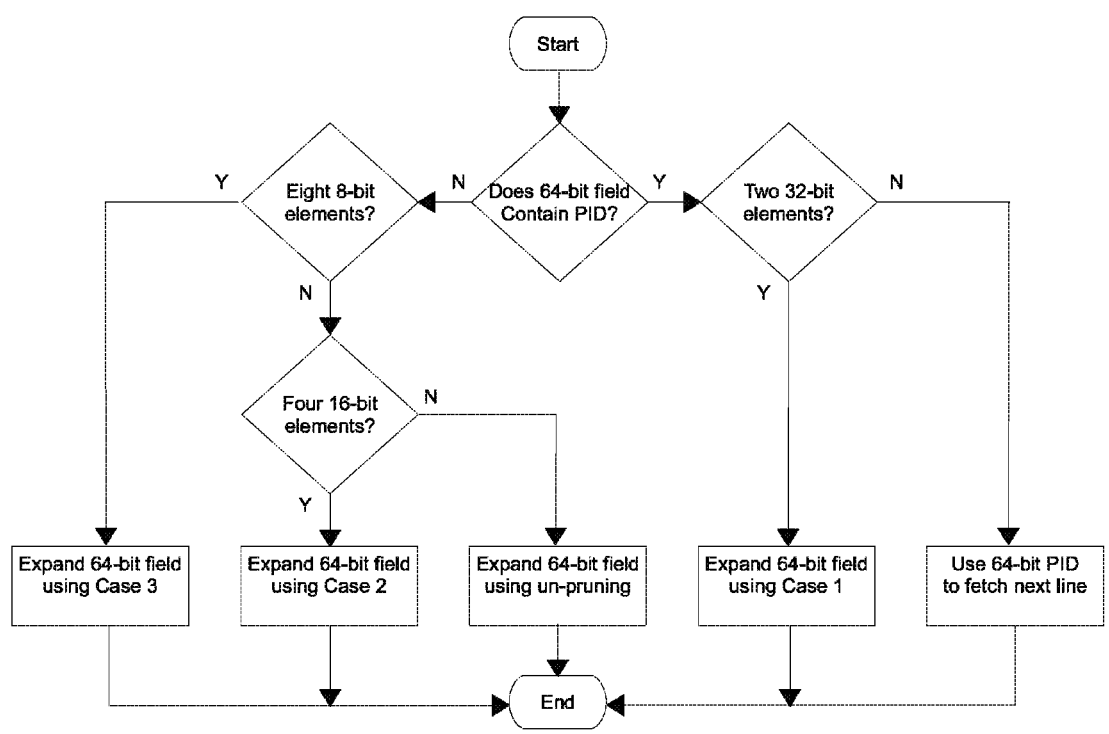
FIG. 15 is a flowchart for expanding a compacted line at level 2.

At level 2 a compacted line can be expanded only if the compaction is of Case 3 or Case 2. Pruning as well as compaction of the parent lines can happen the same way as level 3. FIG. 15 shows a flowchart of expanding a compacted line at this level.

Level 1.

Figure 16:
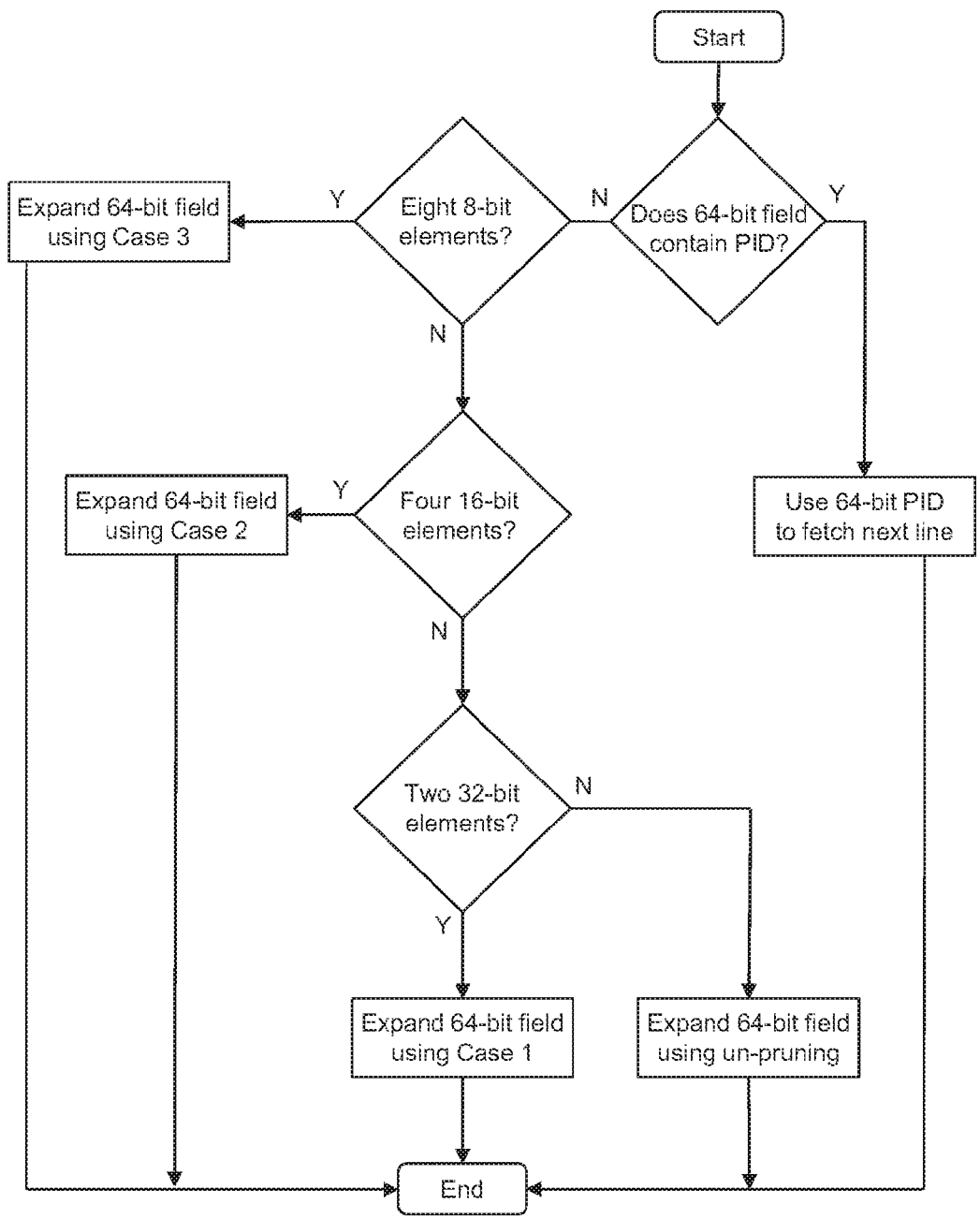
FIG. 16 is a flowchart for expanding a compacted line at level 1.

All compaction cases are possible at level 1 and can be easily detected by checking the W flag of the 64-bit field in the parent. However, compaction of parent lines is not possible because leaf lines never contain PIDs. FIG. 16 shows a flowchart for expanding compacted lines at level 1.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system comprising:
a memory to store data in a pointer-linked data structure, the pointer-linked data structure including a plurality of nodes; and
a processor in communication with the memory, the processor including at least one iterator register, wherein the iterator register is to store a first pointer chain that specifies a location of a first data element within the pointer-linked data structure from a root node, of the plurality of nodes, to a leaf node, of the plurality of nodes, wherein the first pointer chain includes a first, a second, and a third pointer, wherein the first pointer points to the second pointer and the second pointer points to the third pointer, and wherein one pointer of the first pointer chain is a non-compacted pointer representation translated from a compacted pointer representation in the pointer-linked data structure; and
wherein when a subsequent access of data in the pointer-linked data structure causes a writing of a second pointer chain, associated with access of a second data element within the pointer-linked data structure, to the iterator register and the second pointer chain includes one or more same pointers as included in the first pointer chain, a first portion of the iterator register is to store only a portion of the second pointer chain not in common with the first pointer chain and a second portion of the iterator register is to retain the one or more same pointers as included in the first pointer chain.

2. The memory system of claim 1, wherein the non-compacted pointer representation is translated from the compacted pointer representation in the pointer-linked data structure by an expansion algorithm corresponding to an algorithm used to generate the compacted pointer representation.

3. The memory system of claim 1, wherein the first pointer chain is represented by a directed acyclic graph (DAG), and the non-compacted pointer representation is translated from the compacted pointer representation depending on a level within the DAG where the non-compacted pointer representation is located.

4. The memory system of claim 1, wherein the non-compacted pointer representation is translated from the compacted pointer representation in the pointer-linked data structure by filling zeros at appropriate bits of the non-compacted pointer representation.

5. The memory system of claim 1, wherein the pointer-linked data structure included in the memory is organized in immutable memory blocks.

6. The memory system of claim 1, wherein the processor is to remove duplicate data in the pointer-linked data structure.

7. The memory system of claim 1, wherein the iterator register is to simultaneously store a plurality of pointer chains.

8. The memory system of claim 1, wherein the iterator register is to maintain a transient line state.

9. The memory system of claim 1, wherein the processor, under execution of one or more instructions, is to activate or inactivate the iterator register.

10. The memory system of claim 1, wherein the iterator register comprises storage that is more rapidly accessible than the memory.

11. The memory system of claim 1, wherein the second pointer chain specifies a location of the second data element from the root node to a second leaf node, of the plurality of nodes.

12. A computer-implemented method comprising:
loading into a selected iterator register, from a memory that stores one or more pointer-linked data structures, a first, a second, and a third pointer associated with a selected pointer-linked data structure, of the one or more pointer-linked data structures, wherein the first, second, and third pointers comprise a first pointer chain that specifies a location of a first data element within the selected pointer-linked data structure from a root node, of a plurality of nodes of the selected pointer-linked data structure, to a first leaf node, of the plurality of nodes, wherein the first, second, and third pointers are to be loaded into respective pointer fields included in the selected iterator register; and
loading into the selected iterator register at least a portion of a second pointer chain having two or more pointers leading to a second data element located within a second leaf node of the selected pointer-linked data structure, wherein, when the second pointer chain includes one or more same pointers as included in the first pointer chain, loading into the selected iterator register only the portion of the second pointer chain not in common with the first pointer chain and retaining the one or more same pointers as included in the first pointer chain,
wherein one pointer of the first pointer chain is a non-compacted pointer representation translated from a compacted pointer representation in the selected pointer-linked data structure.

13. The computer-implemented method of claim 12, wherein the non-compacted pointer representation is translated from the compacted pointer representation in the selected pointer-linked data structure by an expansion algorithm corresponding to an algorithm used to generate the compacted pointer representation.

14. The computer-implemented method of claim 12, wherein the first pointer chain is represented by a directed acyclic graph (DAG), and the non-compacted pointer representation is translated from the compacted pointer representation depending on a level within the DAG where the non-compacted pointer representation is located.

15. The computer-implemented method of claim 12, wherein the non-compacted pointer representation is translated from the compacted pointer representation in the selected pointer-linked data structure by filling zeros at appropriate bits of the non-compacted pointer representation.

16. The computer-implemented method of claim 12, wherein the selected pointer-linked data structure included in the memory is organized in immutable memory blocks.

17. The computer-implemented method of claim 12, wherein the selected pointer-linked data structure does not include duplicate data.

18. The computer-implemented method of claim 12, wherein the selected iterator register is to simultaneously store a plurality of pointer chains.

19. The computer-implemented method of claim 12, wherein the selected iterator register is to maintain a transient line state.

20. The computer-implemented method of claim 12, further comprising:
activating or inactivating the selected iterator register under execution of one or more instructions by a processor.

21. The computer-implemented method of claim 12, wherein the iterator register comprises storage that is more rapidly accessible than the memory.

22. The computer-implemented method of claim 12, wherein the second pointer chain specifies a location of the second data element from the root node to the second leaf node, of the plurality of nodes.

23. A method of modifying data stored in a computer memory system, the method comprising:
generating a local state associated with a selected iterator register,
wherein the iterator register stores a pointer chain that specifies a location of a data element within a pointer-linked data structure from a root node, of a plurality of nodes of the pointer-linked data structure, to a leaf node, of the plurality of nodes, wherein the pointer chain includes a first, a second, and a third pointer, wherein the first pointer points to the second pointer and the second pointer points to the third pointer, wherein the first, second, and third pointers are stored in respective pointer fields of the iterator register, and wherein the iterator register subsequently stores another pointer chain that specifies a location of another data element different from the data element by storing only one or more pointers included in the another pointer chain that is different from the pointer chain when the another pointer chain and the pointer chain have one or more pointers in common and retaining the one or more pointers in common from the pointer chain, and wherein one pointer of the pointer chain is a non-compacted pointer representation translated from a compacted pointer representation in the pointer-linked data structure;
wherein generating the local state includes performing one or more register operations relating to the selected iterator register and involving pointers in the pointer fields of the selected iterator register;
wherein the local state refers to any state in the iterator register, including a stored state within the pointer fields; and
updating the pointer-linked data structure in a memory system according to the local state.

24. The method of claim 23, wherein the non-compacted pointer representation is translated from the compacted pointer representation in the pointer-linked data structure by an expansion algorithm corresponding to an algorithm used to generate the compacted pointer representation.

25. The method of claim 23, wherein the first pointer chain is represented by a directed acyclic graph (DAG), and the non-compacted pointer representation is translated from the compacted pointer representation depending on a level within the DAG where the non-compacted pointer representation is located.

26. The method of claim 23, wherein the non-compacted pointer representation is translated from the compacted pointer representation in the pointer-linked data structure by filling zeros at appropriate bits of the non-compacted pointer representation.

* * * * *